United States Patent [19]

Niwa

[11] Patent Number: 5,420,043
[45] Date of Patent: May 30, 1995

[54] METHOD OF MANUFACTURING A SOLAR CELL

[75] Inventor: Mitsuyuki Niwa, Nagahama, Japan

[73] Assignee: Canon Kabushiki Kaisha, Tokyo, Japan

[21] Appl. No.: 197,875

[22] Filed: Feb. 17, 1994

Related U.S. Application Data

[62] Division of Ser. No. 948,317, Sep. 22, 1992, Pat. No. 5,324,365.

[30] Foreign Application Priority Data

Sep. 24, 1991 [JP] Japan ................... 3-272092
Sep. 24, 1991 [JP] Japan ................... 3-272093

[51] Int. Cl.$^6$ .............. H01L 31/18; H01L 31/20; H01L 31/0224
[52] U.S. Cl. .................. 437/4; 204/192.29; 427/576; 427/528; 427/529; 427/255.2; 427/255.3; 437/181
[58] Field of Search .......... 437/4, 181; 136/256, 136/258 AM; 204/192.29; 427/74, 576, 528–529, 255.2, 255.3

[56] References Cited

U.S. PATENT DOCUMENTS

| | | | |
|---|---|---|---|
| 4,064,521 | 12/1977 | Carlson | 257/54 |
| 4,226,897 | 10/1980 | Coleman | 437/165 |
| 5,057,244 | 10/1991 | Nitta et al. | 252/501.1 |
| 5,064,477 | 11/1991 | Delahoy | 136/256 |
| 5,078,803 | 1/1992 | Pier et al. | 136/256 |
| 5,101,260 | 3/1992 | Nath et al. | 257/53 |

FOREIGN PATENT DOCUMENTS

| | | | |
|---|---|---|---|
| 55-108780 | 8/1980 | Japan | H01L 31/04 |
| 55-125681 | 9/1980 | Japan | H01L 031/04 |
| 56-69875 | 6/1981 | Japan | H01L 31/04 |

OTHER PUBLICATIONS

*Nineteenth IEEE Photovoltaic Specialists Conference* (1987), W. Kusian et al. pp. 599–603, "Enhanced Blue Response of Top a–Si:H Solar Cells for Tadnem Structures".

*Technical Digest, 3rd International Photovoltaic Science and Engineering Conference*, Nov. 1987, pp. 171–174, Yutaka Hattori et al., "High Efficiency Amorphous Heterojunction Solar Cell Employing ECR–CVD Produced p–type Microcrystalline SiC Film".

*Solid State Communications*, vol. 17, pp. 1193–1196, 1975, W. E. Spear et al., "Substitutional Doping of Amorphous Silicon".

*Solar Energy Materials*, vol. 13, pp. 75–84, 1986, C. X. Qiu et al., "Tin–and Indium–Doped Zinc Oxide Films Prepared by RF Magnetron Sputtering".

*Japanese Journal of Applied Physics*, vol. 20 (1981), Supplement 20-2, pp. 219–225, Yoshihisa Tawada et al., "Optimizations of the Film Deposition Parameters for the Hydrogenated Amorphous Silicon Solar Cell".

Igasaki & Shimaoka, *Research Report of Shizuoka University, Electronic Engineering Lab.*, vol. 21, No. 1, 1986; pp. 23–35.

Koinuma et al., *Transactions of the Society of Japanese Ceramics*, vol. 97, No. 10, 1989, pp. 1160–1163.

*Optical Materials*, H. C. Pan et al.; "Nitrogen Doping of ZnO Prepared by Organometallic Chemical Vapor Deposition" pp. 215–219; Processing and Science Symposium, San Diego, Calif., U.S.A. 24–26 Apr. 1989.

*Primary Examiner*—Aaron Weisstuch
*Attorney, Agent, or Firm*—Fitzpatrick, Cella, Harper & Scinto

[57] ABSTRACT

A solar cell has a semiconductor layer sandwiched between first and second electrodes, wherein a zinc oxide layer containing carbon atoms, nitrogen atoms, or carbon and nitrogen atoms is located between the semiconductor layer and at least one of the first and second electrodes. The density of carbon atoms, nitrogen atoms, or carbon and nitrogen atoms in the zinc oxide layer is constant or continuously changed within the range of 5 atm % or less.

36 Claims, 9 Drawing Sheets

METHOD OF MANUFACTURING A SOLAR CELL

This application is a division of application Ser. No. 07/948,317, filed Sep. 22, 1992, now U.S. Pat. No. 5,324,365, issued Jun. 28, 1994.

BACKGROUND OF THE INVENTION

1. Field of the Invention

The present invention relates to a solar cell and, more particularly, to a solar cell in which output characteristics are stably improved and degradation is prevented.

2. Related Background Art

In recent years, strong worldwide demand has arisen for increased power supply, and active power generation to answer this demand now poses a serious problem of environmental pollution.

Under these circumstances, a power generation scheme of solar cells using sunlight has received a great deal of attention as a clean power generation scheme in which problems posed by terrestrial warming caused by radioactive contamination and emission of gases having a greenhouse effect can be solved. Moreover, energy sources are less localized because sunlight is radiated on the entire area of the earth, and relatively high power generation efficiency can be obtained without requiring complicated bulky equipment. Thus, this power generation scheme is expected to cope with increased future power supply demand without destroying the environment, and various studies have been made for practical applications of the scheme.

In order to establish a power generation scheme which uses solar cells, and which can satisfy power supply needs, the solar cell must have sufficiently high efficiency of photoelectric conversion and stable characteristics and must allow mass-production as the basic requirements.

For this reason, the following solar cell and manufacturing method have received a great deal of attention. That is, an easily accessible source gas such as silane is used and decomposed by glow discharge to deposit a semiconductor thin film such as non-monocrystalline silicon on a relatively inexpensive substrate such as a glass substrate or a metal sheet, thereby mass-producing solar cells. These solar cells can be manufactured with a very small amount of energy at a low cost as compared with a monocrystalline silicon solar cell or the like.

The study of applications of non-monocrystalline silicon to photovoltaic elements such as solar cells was started with the invention of a solar cell by D. E. Carlson (U.S. Pat. No. 4,064,521) based on the success of doping such materials by W. E. Spear and P. G. LeComber (*Solid State Communications*, Vol. 17, pp. 1193–1196, 1975). Although the field of solar cells has a short history of research and development, a variety of fruitful studies have been reported.

Semiconductor layers as important constituent elements of a solar cell form semiconductor junctions such as the so-called p-n and p-i-n junctions. These semiconductor junctions can be formed by sequentially stacking semiconductor layers having different conductivity types, or incorporating a dopant having a conductivity type different from that of a given semiconductor layer into said semiconductor layer in accordance with ion implantation or the like, or by diffusion of a dopant by thermal diffusion. A solar cell obtained using a thin film semiconductor such as amorphous silicon as the non-monocrystalline silicon described above has been studied. In the manufacture of the solar cell according to known techniques, a source gas containing an element serving as a dopant such as phosphine ($PH_3$ for n-type semiconductor) or diborane ($B_2H_6$ for p-type semiconductor) is mixed in silane serving as a main source gas, and the gas mixture is decomposed by glow discharge or the like to obtain a semiconductor film having a desired conductivity type. Such semiconductor films are sequentially stacked on a desired substrate in a p-i-n or n-i-p structure, thereby easily obtaining a semiconductor junction.

As a result of these studies, solar cells using non-monocrystalline silicon have already been used in a variety of power generation applications, e.g. compact devices such as a wristwatch/clock, a compact calculator, and a street light. When non-monocrystalline silicon is to be applied to a large device for power generation, many problems left unsolved (e.g., lower conversion efficiency than that of a monocrystalline or compound semiconductor solar cell, and degradation) must be solved. These problems are posed as disadvantages of the non-monocrystalline silicon solar cells. Numerous attempts have been made to solve these problems.

For example, these attempts include the use of p-type non-monocrystalline silicon carbide having a large forbidden band width as an incident-side window layer (Y. Uchida, US-Japan Joint Seminar, Technological Applications of Tetrahedral Amorphous Solids, Palo Alto, Calif. (1982)), use of p-type silicon carbide having fine crystal grains as a window layer (Y. Uchida et al., Technical Digest of the International PVSEC-3, Tokyo, Japan (1987) A-IIa-3 pp. 171–174), and the like.

In the use of non-monocrystalline silicon carbide having a large forbidden band width as a window layer, there is attempted a method of forming a so-called graded buffer layer (i.e., the forbidden band width is continuously changed) in which an energy band step formed at the p-i interface is eliminated to prevent the efficiency of photoelectric conversion from being degraded, in a short-wavelength range, the degradation being caused by redistribution or recombination of the carriers (R. R. Arya et al., Technical Digest of the International PVSEC-3, Tokyo, Japan 1987 A-IIIa-4).

According to another attempt, phosphorus atoms (P) or boron atoms (B) are doped in an i-type layer in a very small amount of 10 ppm or less to increase the carrier mobility in the i-type layer (W. Kuwano et al., The Conference Record of the Nineteenth IEEE Photovoltaic Specialists Conference-1987, P. 599; M. Kondo et al., The Conference Record of the Nineteenth IEEE Photovoltaic Specialists Conference-1987, p. 604).

According to still another attempt, p- and n-type dopants are diffused in a semiconductor layer having another conductivity type to weaken the semiconductor junctions at the p-n, p-i, and n-i interfaces, thereby preventing degradation in efficiency of photoelectric conversion of a photovoltaic element. An example of such an attempt is disclosed in Japanese Laid-Open Patent Application No. 55-125681 (applicant: Sanyo Electric Co., Ltd.). This prior art discloses a method of forming a solar cell by arranging a partition door in a plasma reaction chamber through which a glass substrate on a conveyor passes. U.S. Pat. No. 4,226,897 (applicant: Plasma Physics Inc.) discloses a method in which spaces for forming respective semiconductor layers are separated from each other by gas gates (i.e., a mechanism in which a gas which does not contribute to film formation forcibly and strongly flows so as to serve as partition walls for the film formation gases) in an apparatus for continuously forming solar cell on an elongated substrate of belt-like shape, thereby preventing a dopant from entering into the wrong film formation space.

Japanese Laid-Open Patent Application No. 56-69875 (applicant: Fuji Electric Co., Ltd.) discloses a method in which a transparent conductive layer is formed between a conductive substrate and a semiconductor layer in a solar cell having the semiconductor layer on the conductive substrate to increase the adhesion strength between the semiconductor layer and the substrate, or to improve the surface smoothness of the substrate, thereby improving the characteristics of the solar cell. Japanese Laid-Open Patent Application No. 55-108780 (applicant: Sharp Corporation) discloses a method in which a decrease in reflectance at an interface caused by formation of an alloy between the semiconductor atoms and a diffused metal element constituting the lower electrode located on the surface of a semiconductor layer at a side opposite to the light-receiving surface can be prevented by forming a transparent conductive layer such as a zinc oxide layer between the lower electrode and the semiconductor layer.

According to still another attempt, tin or indium is doped in a zinc oxide layer to decrease the resistivity of the zinc oxide layer (C. X. Qiu, I. Shin, Solar Energy Materials, Vol. 13, No. 2, pp. 75–84, 1986). An example of aluminum doping in a zinc oxide layer is also reported (Igasaki & Shimaoka, Research Report of Shizuoka University, Electronic Engineering Lab., Vol. 21, No. 1, 1986), and an example of fluorine doping is also reported (Koinuma et al., Transactions of the Society of Japanese Ceramics, Vol. 97, No. 10, pp. 1160–1163, 1989).

As a result of efforts made by a number of engineers in addition to the above attempts, the disadvantages (e.g., low efficiency of photoelectric conversion and degradation) of non-monocrystalline silicon solar cells have been improved. However, the following problems are still left unsolved.

When a solar cell is formed by forming a semiconductor layer on a conductive substrate through a zinc oxide layer, the adhesion strengths between the zinc oxide layer and the conductive substrate and between the zinc oxide layer and the semiconductor layer are not sufficient. Slight peeling may occur due to temperature shocks and vibrations in formation of the semiconductor layer and the subsequent step. This peeling poses a problem of initial characteristics, i.e., degradation in efficiency of photoelectric conversion of the solar cell.

In addition, since the resistivity of the zinc oxide layer cannot be reduced to a negligible degree, an increase in series resistance of the solar cell can be expected, thus posing a problem of initial characteristics, i.e., degradation in efficiency of photoelectric conversion of the solar cell.

This also applies not only to formation of the semiconductor layer on the conductive substrate but also to a solar cell in which a transparent conductive layer is formed on a transparent insulating substrate and a semiconductor layer is formed on the transparent conductive layer. More specifically, slight peeling occurs between the transparent conductive layer and the semiconductor layer even during the manufacture due to insufficient adhesion strength between the transparent conductive layer and the semiconductor layer, thereby posing a problem of initial characteristics, i.e., degradation in efficiency of photoelectric conversion of solar cell.

Even if slight peeling does not occur in the manufacture of a solar cell and efficiency of photoelectric conversion in the initial manufacturing period of the solar cell is rather high, slight peeling may occur between the conductive substrate and the transparent conductive layer and between the transparent conductive layer and the semiconductor layer in practical application states under various climatic and installation conditions, thereby degrading reliability due to gradual degradation in efficiency of photoelectric conversion of the solar cell.

SUMMARY AND OBJECTS OF THE INVENTION

The present invention has been made in consideration of the above, and has as an object to provide a solar cell having a semiconductor layer sandwiched between first and second electrodes, wherein adhesion strengths between the respective layers are increased to effectively prevent the characteristics from being degraded by slight film peeling occurring during the manufacture, thereby improving the initial characteristics.

It is another object of the present invention to provide a solar cell in which adhesion strengths between the respective layers are increased to effectively prevent the characteristics from being degraded by the slight film peeling occurring under practical application conditions, thereby improving the reliability.

It is still another object of the present invention to provide a solar cell in which the resistance of a zinc oxide layer is decreased to decrease the series resistance of the solar cell, thereby improving the initial efficiency.

The present invention has been achieved based upon extensive studies of the present inventor to achieve the above objects of the present invention, and there is provided a solar cell having a semiconductor layer sandwiched between first and second electrodes, wherein a zinc oxide layer containing carbon atoms is located between the semiconductor layer and at least one of the first and second electrodes.

The density of carbon atoms in the zinc oxide layer may be constant within the range of 5 atm % or less or may be continuously changed within the range of 5 atm % or less.

According to the present invention, there is also provided a solar cell having a semiconductor layer sandwiched between first and second electrodes, wherein a zinc oxide layer containing nitrogen atoms is located between the semiconductor layer and at least one of the first and second electrodes.

The density of nitrogen atoms in the zinc oxide layer may be constant within the range of 5 atm % or less or may be continuously changed within the range of 5 atm % or less.

According to the present invention, there is also provided a solar cell having a semiconductor layer sandwiched between first and second electrodes, wherein a zinc oxide layer containing carbon and nitrogen atoms is located between the semiconductor layer and at least one of the first and second electrodes.

The density of carbon and nitrogen atoms in the zinc oxide layer may be constant within the range of 5 atm % or less or may be continuously changed within the range of 5 atm % or less.

A solar cell manufactured by the technique of the present invention using a zinc oxide film containing carbon atoms, nitrogen atoms, or carbon and nitrogen atoms has higher adhesion strengths between the respective layers and hence better initial characteristics and higher reliability than those of a solar cell manufactured by a conventional technique using a zinc oxide layer not containing carbon atoms, nitrogen atoms, or carbon and nitrogen atoms.

The reason why the adhesion strength is increased by containing carbon atoms, nitrogen atoms, or carbon and nitrogen atoms in the zinc oxide layer is not yet clarified. However, it is assumed that the carbon atoms, nitrogen atoms, or carbon and nitrogen atoms in the zinc oxide layer cause a change in a bond or crystalline state to effectively relax various mechanical and thermal stresses which may cause the slight peeling during the manufacture or during practical use in conventional solar cells.

According to the present invention, the density of carbon atoms in the zinc oxide layer is preferably constant within the range of 5 atm % or less. The adhesion strength of the film can be increased within the above range, and the initial characteristics including efficiency of photoelectric conversion can be improved. The "constant density" in the present invention includes ±10% variations with respect to the average density.

When the carbon density in the zinc oxide layer is continuously changed within the range of 5 atm % or less, the adhesion strength of the layer can be further increased, and the initial characteristics and reliability of the solar cell are also further improved due to the following reason. When the density of carbon atoms in the zinc oxide layer has a given distribution, the structure in the zinc oxide layer is changed to relax the stress caused by the formation of different types of deposition films on two sides of the zinc oxide layer and various external stresses, thereby effectively preventing the slight film peeling occurring during the manufacture and practical use.

According to the present invention, the density of nitrogen atoms in the zinc oxide layer is preferably constant within the range of 5 atm % or less. The adhesion strength of the film can be increased within the above range, and the initial characteristics including efficiency of photoelectric conversion can be improved. The "constant density" in the present invention includes ±10% variations with respect to the average density.

When the nitrogen density in the zinc oxide layer is continuously changed within the range of 5 atm % or less, the adhesion strength of the layer can be further increased, and the initial characteristics and reliability of the solar cell also further improved due to the following reason. When the density of nitrogen atoms in the zinc oxide layer has a given distribution, the structure in the zinc oxide layer is changed to relax the stress caused by formation of different types of deposition films on two sides of the zinc oxide layer and various external stresses, thereby effectively preventing the slight film peeling occurring during the manufacture and practical use.

According to the present invention, the total density of carbon and nitrogen atoms in the zinc oxide layer is preferably constant within the range of 5 atm % or less. The adhesion strength of the film can be increased within the above range, and the initial characteristics including the efficiency of photoelectric conversion can be improved. The "constant density" in the present invention includes ±10% variations with respect to the average density.

When the total density of carbon and nitrogen atoms in the zinc oxide layer is continuously changed within the range of 5 atm % or less, the adhesion strength of the layer can be further increased, and the initial characteristics and reliability of the solar cell are also further improved due to the following reason. When the mixing density of carbon and nitrogen atoms in the zinc oxide layer has a given distribution, the structure in the zinc oxide layer is changed to relax the stress caused by the formation of different types of deposition films on two sides of the zinc oxide layer and various external stresses, thereby effectively preventing the slight film peeling occurring during the manufacture and practical use.

The series resistance characteristics of the solar cell manufactured by the technique of a present invention are better than those of a solar cell manufactured by the conventional technique. As a result, the fill factor can be increased, and hence the efficiency of photoelectric conversion can be improved because it is assumed that the carbon and nitrogen atoms contained in the zinc oxide layer effectively serve as doping materials to effectively decrease the resistivity of the zinc oxide layer.

DETAILED DESCRIPTION OF THE PREFERRED EMBODIMENTS

Structures for realizing the present invention will be described with reference to the accompanying drawings.

Figure 1:
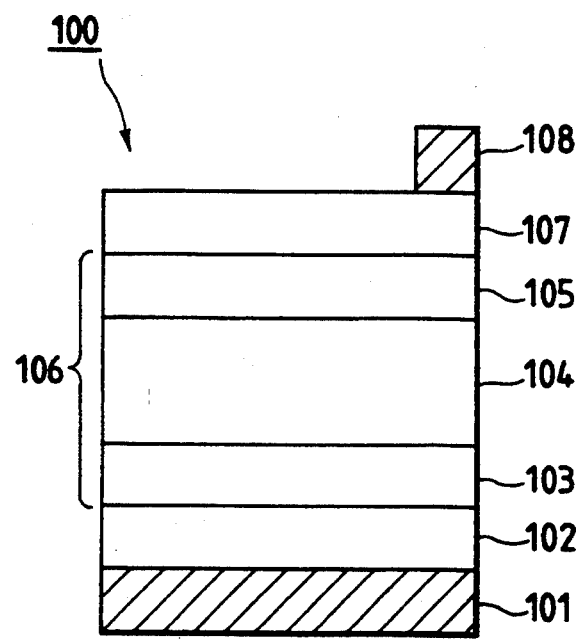
FIG. 1 is a conceptual view for explaining a solar cell according to an embodiment of the present invention.

FIG. 1 is a view illustrating a typical structure of a solar cell according to the present invention. In a solar cell 100 (FIG. 1) as a typical example of the present invention, a zinc oxide layer 102 containing carbon atoms, nitrogen atoms, or carbon and nitrogen atoms is formed on a conductive substrate 101 serving as the first electrode, a pin type solar cell element 106 consisting of an n-type semiconductor layer 103, an i-type semiconductor layer 104, and a p-type semiconductor layer 105 is formed on the zinc oxide layer 102, and a transparent electrode 107 serving as the second electrode and a collector electrode 108 are sequentially formed on the pin type solar cell element 106. Light is incident through the transparent electrode 107.

The solar cell according to the present invention is greatly different from the conventional solar cell in that a zinc oxide layer 102 containing carbon atoms, nitrogen atoms, or carbon and nitrogen atoms is formed.

Figure 2:
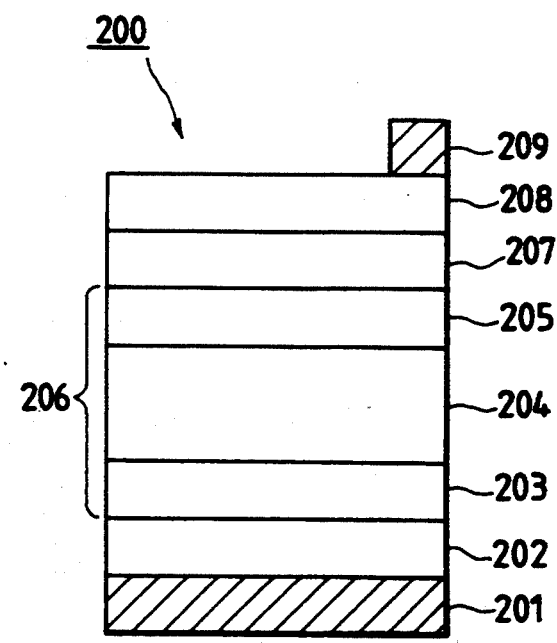
FIG. 2 is a conceptual view for explaining a solar cell according to another embodiment of the present invention.

FIG. 2 is a view illustrating another typical structure of a solar cell according to the present invention. In a solar cell 200 (FIG. 2) of this typical example, a zinc oxide layer 202 containing carbon atoms, nitrogen atoms, or carbon and nitrogen atoms is formed on a conductive substrate 201 serving as the first electrode, a pin type solar cell element 206 consisting of an n-type semiconductor layer 203, an i-type semiconductor layer 204, and a p-type semiconductor layer 205 is formed on the zinc oxide layer 202, and a zinc oxide layer 207 containing carbon atoms, a transparent electrode 208 serving as the second electrode, and a collector electrode 209 are sequentially formed on the pin type solar cell element 206. Light is incident through the transparent electrode 208.

Figure 3:
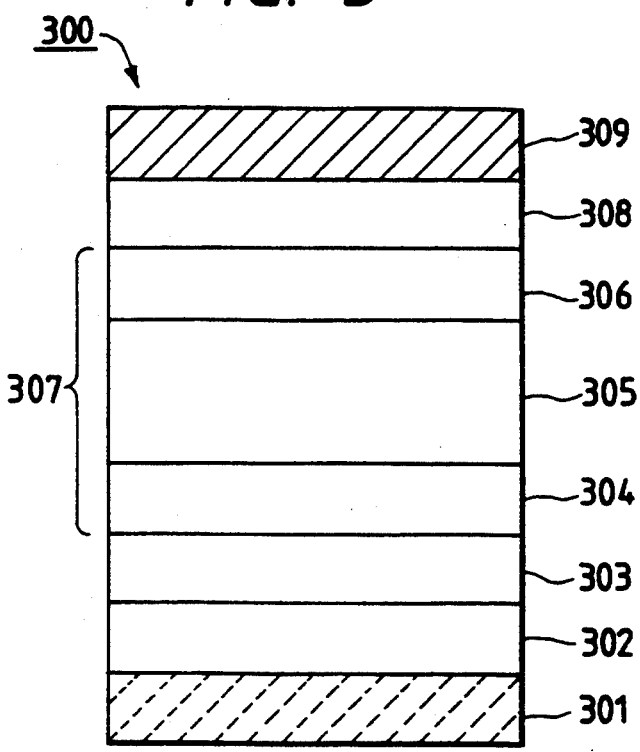
FIG. 3 is a conceptual view for explaining a solar cell according to still another embodiment of the present invention.

FIG. 3 is a view illustrating still another typical example of a solar cell according to the present invention. In a solar cell 300 (FIG. 3) of this typical example, a transparent electrode 302 serving as the first electrode is formed on a transparent substrate 301, and a zinc oxide layer 303 containing carbon atoms, nitrogen atoms, or carbon and nitrogen atoms is formed on the transparent electrode 302. A pin type solar cell element 307 consisting of a p-type semiconductor layer 304, an i-type semiconductor layer 305, and an n-type semiconductor layer 306 is formed on the zinc oxide layer 303. A zinc oxide layer 308 containing carbon atoms, nitrogen atoms, or carbon and nitrogen atoms, and a lower or rear electrode 309 serving as the second electrode are sequentially formed on the pin type solar cell element 307. Light is incident through the transparent substrate 301.

Figure 4:
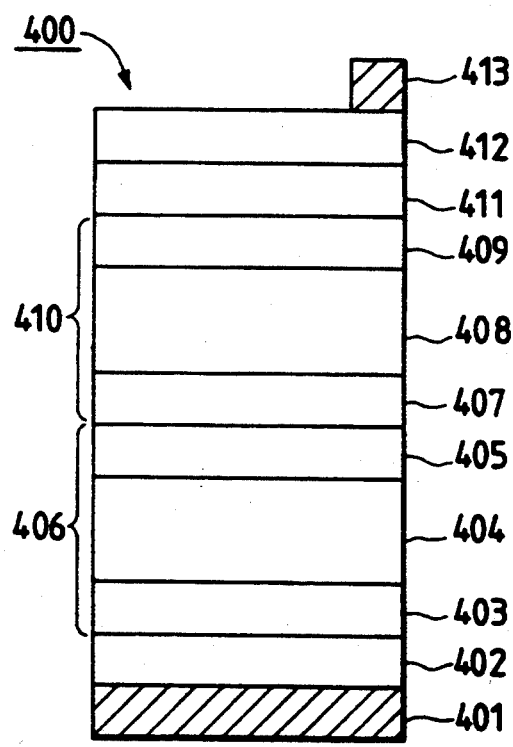
FIG. 4 is a conceptual view for explaining a solar cell according to still another embodiment of the present invention.

FIG. 4 is a view illustrating still another typical example of a solar cell according to the present invention. A solar cell 400 of this example is a so-called tandem cell in which pin type solar cell elements including two different semiconductor layers having different band gaps or film thicknesses as i-type layers are stacked to obtain a two-element structure. In the solar cell 400 shown in FIG. 4, a zinc oxide layer 402 containing carbon atoms, nitrogen atoms, or carbon and nitrogen atoms is formed on a conductive substrate 401 serving as the first electrode. A first pin type solar cell element 406 consisting of a first n-type semiconductor layer 403, a first i-type semiconductor layer 404, and a first p-type semiconductor layer 405 is formed on the zinc oxide layer 402. A second pin type solar cell element 410 consisting of a first second n-type semiconductor layer 407, a second i-type semiconductor layer 408, and a second p-type semiconductor layer 409 is formed on the first pin type solar cell element 406. A zinc oxide layer 411 containing carbon atoms, nitrogen atoms, or carbon and nitrogen atoms, a transparent electrode 412 serving as the second electrode, and a collector electrode 413 are sequentially formed on the second p-type semiconductor layer 409. Light is incident through the transparent electrode 412.

In any solar cell example described above, the stacking order of the n- and p-type semiconductor layers can be reversed in accordance with an application purpose. However, the p-type semiconductor layer is preferably formed close to the light-incident side because the generated carriers can then be effectively utilized.

The constituent elements of these solar cells will be described below.

Substrate

Applicable materials for the conductive substrate 101 can be exemplified by a plate or film consisting of a material selected from molybdenum, tungsten, titanium, cobalt, chromium, iron, copper, tantalum, niobium, zirconium, metal aluminum, and alloys thereof. In addition, stainless steel, a nickel-chromium alloy, nickel, tantalum, niobium, zirconium, metal titanium, and/or alloys thereof can be preferably used in view of corrosion resistance. A film or sheet of a synthetic resin (e.g., polyester, polyethylene, polycarbonate, cellulose acetate, polypropylene, polyvinyl chloride, polyvinylidene chloride, polystyrene, or polyamide), glass, or ceramic on which one of the above metals and/or alloys thereof is formed by various methods such as deposition and sputtering can be used.

The conductive substrate 101 can be used singly, but a layer (referred to as a reflective conductive layer) having reflection properties with respect to visible light and electrical conductivity is preferably formed on the conductive substrate 101 to utilize light having passed through the semiconductor layer without being absorbed or to reduce the series resistance of the solar cell. Examples of applicable materials for the reflective conductive layer are silver, silicon, aluminum, iron, copper, nickel, chromium, molybdenum, and alloys thereof. Of these materials, silver, copper, aluminum, and an aluminum-silicon alloy are preferable. In addition, the reflective conductive layer may have a large thickness, and this thick reflective conductive layer may serve as the substrate itself.

Examples of preferable methods of forming a reflective conductive layer on the surface of the conductive substrate 101 are resistance heating deposition, electron beam deposition, sputtering or the like.

Applicable materials for the transparent substrate 301 are a film or sheet consisting of a material selected form polyester, polyethylene, polycarbonate, cellulose acetate, polypropylene, polyvinyl chloride, polyvinylidene chloride, polystyrene, polyamide or the like, or a multilayered structure thereof; a glass; or the like.

Electrode

Appropriate electrodes are selected in accordance with the structural forms of the solar cells according to the present invention. Electrodes of these solar cells are a lower electrode, an upper electrode (transparent electrode), and a collector electrode. (Note that the upper electrode is defined as an electrode on the light-incident side, and the lower electrode is defined as an electrode arranged to oppose the upper electrode so as to sandwich a semiconductor electrode therewith.)

The position of the lower electrode used in the solar cell according to the present invention varies depending on differences in the light incident surface in accordance with whether the substrate material is transparent or not.

More specifically, in the multilayered structures shown in FIGS. 1, 2, and 4, the conductive substrates 101, 201, and 401 also serve as the lower electrodes.

In the multilayered structure shown in FIG. 3, since the transparent substrate 301 is used and light is incident from the transparent substrate 301, the rear electrode (lower electrode) 309 is formed to oppose the transparent substrate 301 so as to sandwich the semiconductor layer and the zinc oxide layer containing carbon atoms, nitrogen atoms, or carbon and nitrogen atoms therebetween, thereby extracting a current and effectively reflecting light which is not absorbed by the semiconductor layer and reaches the electrode.

Preferable examples of the material for the lower electrode of the solar cell of the present invention are metals (e.g., silver, gold, platinum, nickel, chromium, copper, aluminum, titanium, zinc, molybdenum, and tungsten) and alloys thereof. A layer made of one of the metals or an alloy thereof is formed in accordance with vacuum deposition, electron beam deposition, sputtering or the like. This metal thin film should not be a resistive component against an output from the solar cell, and preferably has a sheet resistance of 50 $\Omega/\square$ or less, and more preferably 10 $\Omega/\square$ or less.

The transparent electrodes 107, 208, 302, and 412 used in the present invention preferably have a transmittance of 70% or more, and more preferably 80% or more to effectively absorb light from the sun, a fluorescent lamp, or the like. Each transparent electrode preferably has a sheet resistance of 300 $\Omega/\square$ or less so as not to serve as an electrical resistance component against the output from the solar cell. Examples of materials having the above requirements include a semi-transparent metal thin film made of a metal oxide (e.g., $SnO_2$, $In_2O_3$, $ZnO$, $CdO$, $Cd_2SnO_4$, or ITO ($In_2O_3$—$SnO_2$)) and a metal (e.g., Au, Al, or Cu). Each transparent electrode can be formed by resistive thermal deposition, electron beam thermal deposition, ion plating, sputtering, or spraying, selected in accordance with desired characteristics of the solar cell.

The collector electrodes 108, 209, and 413 used in the present invention are formed on the corresponding transparent electrodes to reduce the sheet resistances of the transparent electrodes 107, 208, and 412. In the solar cells having the structures shown in FIGS. 1, 2, and 4, since the transparent electrodes are formed after the corresponding semiconductor layers are formed, the substrate temperature at the time of formation of the transparent electrodes cannot be set relatively high. For this reason, since the sheet resistances of the transparent electrodes inevitably become high, the collector electrodes 108, 209, and 413 are preferably formed. On the other hand, in the solar cell having the structure shown in FIG. 3, since the transparent electrode 302 is directly formed on the substrate, the substrate temperature can be set high, and the sheet resistance of the transparent electrode 302 can be set relatively low. Therefore, the collector electrode may be omitted or reduced.

Examples of the material for the collector electrode preferably used in the solar cell are metals (e.g., silver, gold, platinum, nickel, chromium, copper, aluminum, titanium, zinc, molybdenum, and tungsten), alloys thereof, and carbon. A layer consisting of each of these metals, an alloy thereof, or carbon is formed in accordance with vacuum deposition, electron beam deposition, or sputtering. Alternatively, such a material is mixed with an organic binder, and this mixture is formed into a layer by printing. When layers of these metals, alloys thereof, or carbon are stacked, advantages (e.g., low resistance, less diffusion into a semiconductor layer, rigidity, and facilitation of electrode formation by printing or the like) of the metals, alloys, or carbon can be combined.

In order to assure a sufficient amount of light incident on a semiconductor layer, the shape and area of each collector electrode are properly designed. The shape of the collector electrode is preferably determined to uniformly spread on the light-receiving surface of the solar cell, and the area of the collector electrode is preferably 15% or less and more preferably 10% or less of the light-receiving surface.

The sheet resistance of the collector electrode is preferably 50 $\Omega/\square$ or less, and more preferably 10 $\Omega/\square$ or less.

Zinc Oxide Layer

Each zinc oxide layer used in the solar cell according to the present invention contains carbon atoms, nitrogen atoms, or carbon and nitrogen atoms, and preferably contains them at a constant density of 5 atm % or less.

Each zinc oxide layer used in the solar cell according to the present invention contains carbon atoms, nitrogen atoms, or carbon and nitrogen atoms, and their density may be continuously changed in the range of 5 atm % or less.

Methods of forming each zinc oxide layer suitably used in the solar cell according to the present invention are exemplified by vacuum deposition, sputtering, an ion cluster beam deposition, chemical vapor deposition, or heating after spraying of a metal salt solution or the like.

A method of adding carbon atoms, nitrogen atoms, or carbon and nitrogen atoms in each zinc oxide layer is exemplified by a method in which carbon atoms, nitrogen atoms, or carbon and nitrogen atoms are mixed in a zinc material at a predetermined mixing ratio when the zinc material is to be heated and deposited in an oxygen atmosphere. When a zinc oxide layer is to be formed by sputtering, sputtering may be performed using a baked powder of zinc oxide containing carbon atoms, nitrogen atoms, or carbon and nitrogen atoms as a sputtering target, or a zinc oxide layer may be formed while zinc metal containing carbon atoms, nitrogen atoms, or carbon and nitrogen atoms as a target may be reacted with oxygen in the sputtering gas. Alternatively, carbon dioxide gas or the like may be supplied to the sputtering gas to mix carbon in the zinc oxide layer. Nitrogen gas, nitrogen oxide gas or the like may be supplied so as to mix nitrogen in the zinc oxide layer. Carbon dioxide gas and nitrogen gas may be supplied at a predetermined ratio to mix carbon and nitrogen in the zinc oxide layer.

When carbon atoms, nitrogen atoms, or carbon and nitrogen atoms are to be contained at a predetermined ratio in the zinc oxide layer at a constant density, variations in carbon density in the zinc oxide layer can fall within the range of 10% if the film formation parameters are kept at predetermined fixed values in a general deposition film formation method represented by each of the above methods.

The method of adding carbon atoms, nitrogen atoms, or carbon and nitrogen atoms in the zinc oxide layer so as to provide a desired density distribution is exemplified as follows. When a zinc material is to be heated and deposited in an oxygen atmosphere, the zinc material placed in a crucible or boat is heated and deposited while carbon, nitrogen, or carbon and nitrogen atom containing materials are charged in the crucible or boat to cause the zinc oxide to contain the carbon atoms, nitrogen atoms, or carbon and nitrogen atoms at a desired density distribution.

Alternatively, carbon atoms, nitrogen atoms, or carbon and nitrogen atoms may be mixed at a predetermined mixing ratio in the zinc material beforehand. In this case, by utilizing a change in composition of a deposition source during the progress of deposition due to a difference between the melting points between zinc and the carbon or nitrogen atoms, the carbon atoms, nitrogen atoms, or carbon and nitrogen atoms in the zinc oxide layer may be controlled to have a density distribution. A desired density distribution and a desired mixing ratio can be realized by controlling the amount and temperature of the deposition source.

When the zinc material is to be heated and deposited in the oxygen atmosphere, nitrogen gas, nitrogen oxide gas, or the like may be supplied in the atmosphere, and zinc oxide formed upon changes in density as a function of time may be controlled to contain nitrogen atoms in a desired density distribution.

When a zinc oxide layer is to be formed by sputtering, sputtering is performed using a baked powder of zinc oxide containing carbon atoms, nitrogen atoms, or carbon and nitrogen atoms as a sputtering target while the discharge power and pressure are appropriately changed, thereby obtaining a desired density distribution. When zinc metal containing carbon atoms is used as a target and reacted with oxygen in the sputtering gas to form a zinc oxide layer, the above method is utilized.

In addition, a thin piece or wire consisting of carbon or nitrogen atoms and having a size adjusted to obtain a desired density distribution may be placed or welded on a target not containing carbon or nitrogen atoms. In this case, the density distribution of the carbon atoms, nitrogen atoms, or carbon and nitrogen atoms in the zinc oxide layer can be adjusted in accordance with the consumption of the thin piece or wire consisting of the carbon and nitrogen atoms.

Any method can be used as a method of forming such a zinc oxide layer containing carbon atoms, nitrogen atoms, or carbon and nitrogen atoms, as suitably used in each solar cell according to the present invention. The present invention is not limited to the above specific method of forming a zinc oxide layer containing carbon atoms, nitrogen atoms, or carbon and nitrogen atoms.

A method of forming a zinc oxide layer containing carbon atoms will be explained in detail below by using DC planar magnetron sputtering, but this method does not limit the scope of the present invention.

Figure 5:
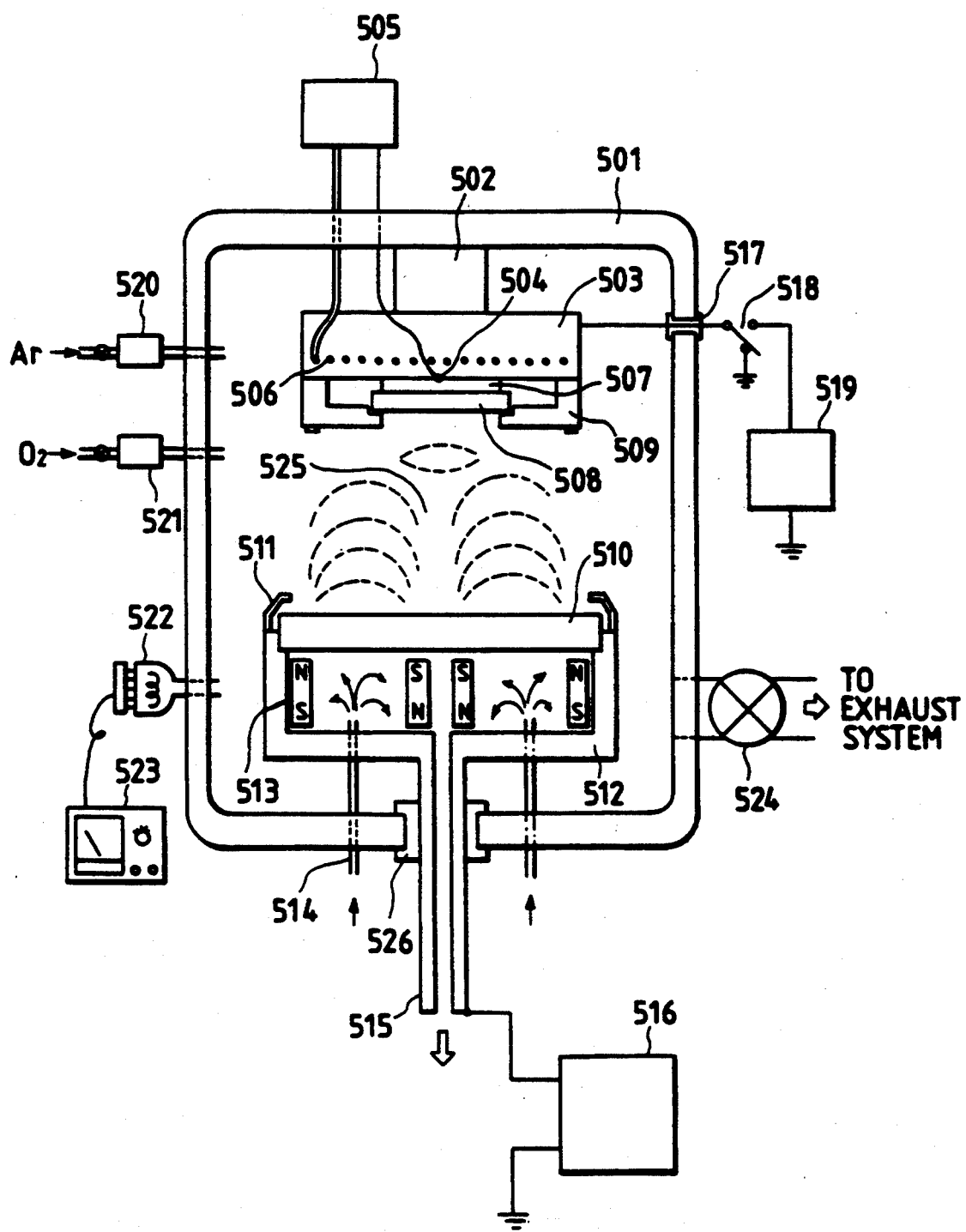
FIG. 5 is a conceptual view illustrating the arrangement of a planar DC magnetron sputtering apparatus as a means for realizing the present invention.

FIG. 5 is a view illustrating the arrangement of a DC planar magnetron sputtering apparatus. DC planar magnetron sputtering has an advantage in that high-speed sputtering can be performed by a compact apparatus. This method can be realized by an RF or RF magnetron apparatus.

Referring to FIG. 5, the DC planar magnetron sputtering apparatus includes a vacuum chamber 501 in which a heating plate 503 is supported on an insulating support pedestal 502. A heater 506 and a thermocouple 504 are embedded in the heating plate 503 and are controlled to a predetermined temperature by a temperature controller 505. The temperature of a substrate 508 during sputtering is determined by the characteristics of a desired zinc oxide layer. At this time, if a semiconductor layer is or has already been formed on the substrate 508, the temperature of the substrate 508 is changed by the semiconductor layer formation conditions such as the formation temperature of the semiconductor layer. When a substrate having a semiconductor layer thereon is heated to a temperature at which the semiconductor layer is formed, it is generally found that hydrogen is eliminated from the semiconductor material constituting the semiconductor layer, or impurity atoms are redistributed to degrade the characteristics of the semiconductor material and semiconductor junction. The crystal grain boundary may be emphasized by heating, depending on the types of metals constituting the substrate and reflective conductive layer. Care must therefore be taken upon setting the substrate temperature. Assuming that the above conditions are taken into consideration, the substrate temperature is set within the range of room temperature to 500° C. The substrate 508 is supported by a substrate holder 509.

A target 510 is arranged opposite the substrate 508. The target 510 is placed on a target table 512, and magnets 513 are located below the target 510 to form a magnetic field in a plasma space 525. Cooling water from cooling water supply pipes 514 for cooling the target heated during sputtering is supplied to the lower surface of the target. The supplied water cools the target and is discharged through a cooling water discharge pipe 515 passing through chamber wall 501 by means of insulative spacer 526.

The target 510 may consist of a baked powder of zinc oxide containing carbon atoms, nitrogen atoms, or carbon and nitrogen atoms, or may consist of zinc oxide with added carbon atoms, nitrogen atoms, or carbon and nitrogen atoms added, as described above. Alternatively, when a mixture of nitrogen gas, nitrogen oxide gas, and the like is supplied to the sputtering gas, the target does not necessarily contain nitrogen atoms.

A DC voltage is applied from a sputtering power source 516 to the target 510 through the target table 512. The DC current supplied from the sputtering power source is set to be preferably 0.01 A or more, and more preferably 0.1 A or more. According to an experiment of the present inventor, at a large sputtering current, the light absorption of the formed zinc oxide film is low, and the efficiency of photoelectric conversion of a solar cell is high (especially a generated current is large). This also applies to the formation of a zinc oxide layer by an RF sputtering method. A solar cell manufactured with a high RF power has an advantage in current generation over a solar cell manufactured with a low RF power.

Each of argon gas and oxygen gas (or nitrogen gas, nitrogen oxide gas, and the like) as a sputtering gas is supplied through a mass flow controller 520 or 521. Other gases such as $SiF_4$ gas may be added to the sputtering gas to dope fluorine in the resultant zinc oxide layer. The flow rate of argon gas is preferably 1 sccm to 1 slm, and the flow rate of oxygen gas is preferably 100 sccm or less.

The internal pressure of the vacuum chamber 501 can be monitored by a vacuum gauge 522 mounted thereon and connected to meter 523. The entire interior of the vacuum chamber 501 is evacuated by a main valve 524 connected to an exhaust system (not shown). The internal pressure of the background prior to sputtering is preferably $10^{-4}$ Torr or less, and more preferably $10^{-5}$ Torr or less. The internal pressure during sputtering is set to be 1 mTorr (inclusive) to 1 Torr (inclusive).

Under the above conditions, the formation of a zinc oxide layer is started. When the thickness of the zinc oxide layer reaches a desired value, power supply from the sputtering power source is interrupted, and the substrate is cooled. The interior of the vacuum chamber is set at atmospheric pressure, and the substrate on which the zinc oxide layer is formed is unloaded. If possible, the substrate is preferably annealed in a vacuum upon formation of the zinc oxide layer in order to increase the transmittance and conductivity of the zinc oxide layer.

Semiconductor Layer

Examples of the semiconductor material constituting an i-type semiconductor layer suitably used in each solar cell according to the present invention are the so-called Group IV and Group IV alloy semiconductor materials such as amorphous (to be referred to as a- hereinafter) Si:H, a-Si:F, a-Si:H:F, a-SiC:H, a-SiC:F, a-SiC:H:F, a-SiGe:H, a-SiGe:F, a-SiGe:H:F, poly-Si:H, poly-Si:F, and poly-Si:H:F.

The hydrogen atom content of the i-type semiconductor layer is preferably 20 atm % or less, and more preferably 10 atm % or less.

A semiconductor material constituting a p- or n-type semiconductor layer suitably used in a solar cell according to the present invention can be obtained by doping a valence control agent in the semiconductor material constituting the i-type semiconductor layer.

The semiconductor material constituting the p- or n-type semiconductor layer preferably contains a crystalline phase because then the light utilization efficiency can be improved and the carrier density can be increased. In this case, the crystal grain has a size of preferably 30 Å or more.

The density of hydrogen contained in the p- or n-type semiconductor layer is preferably 5 atm % or less, and more preferably 1 atm % or less.

Semiconductor layer formation source gases used in forming these semiconductor layers are gases of elements constituting the respective semiconductor layers, hydroxides thereof, halides thereof, organic metal compounds, and the like. Any material which can be supplied to the film formation space in a gaseous phase can be preferably used.

These source gases can be used singly or as a mixture of two or more sources gases. These source gases may be diluted with a dilution gas such as He, Ne, Ar, Kr, Xe, or Rn, and another dilution gas such as $H_2$, HF or HCl and the diluted source gas may be supplied to the film formation space.

The methods for forming each semiconductor layer used in a solar cell according to the present invention are exemplified by microwave plasma CVD, RF plasma CVD, sputtering, reactive sputtering, ion plating, photo-CVD, thermal-CVD, MOCVD, MBE, HR-CVD, or the like, which can be used in a so-called semiconductor deposition film forming means.

A method of forming a semiconductor layer suitably used in a solar cell according to the present invention will be described with reference to the accompanying drawings. Microwave (2.45 GHz, to be referred to as "$\mu W$" hereinafter) plasma CVD and RF plasma CVD will be exemplified. However, the present invention is not limited thereto.

$\mu W$ Plasma CVD

Figure 6:
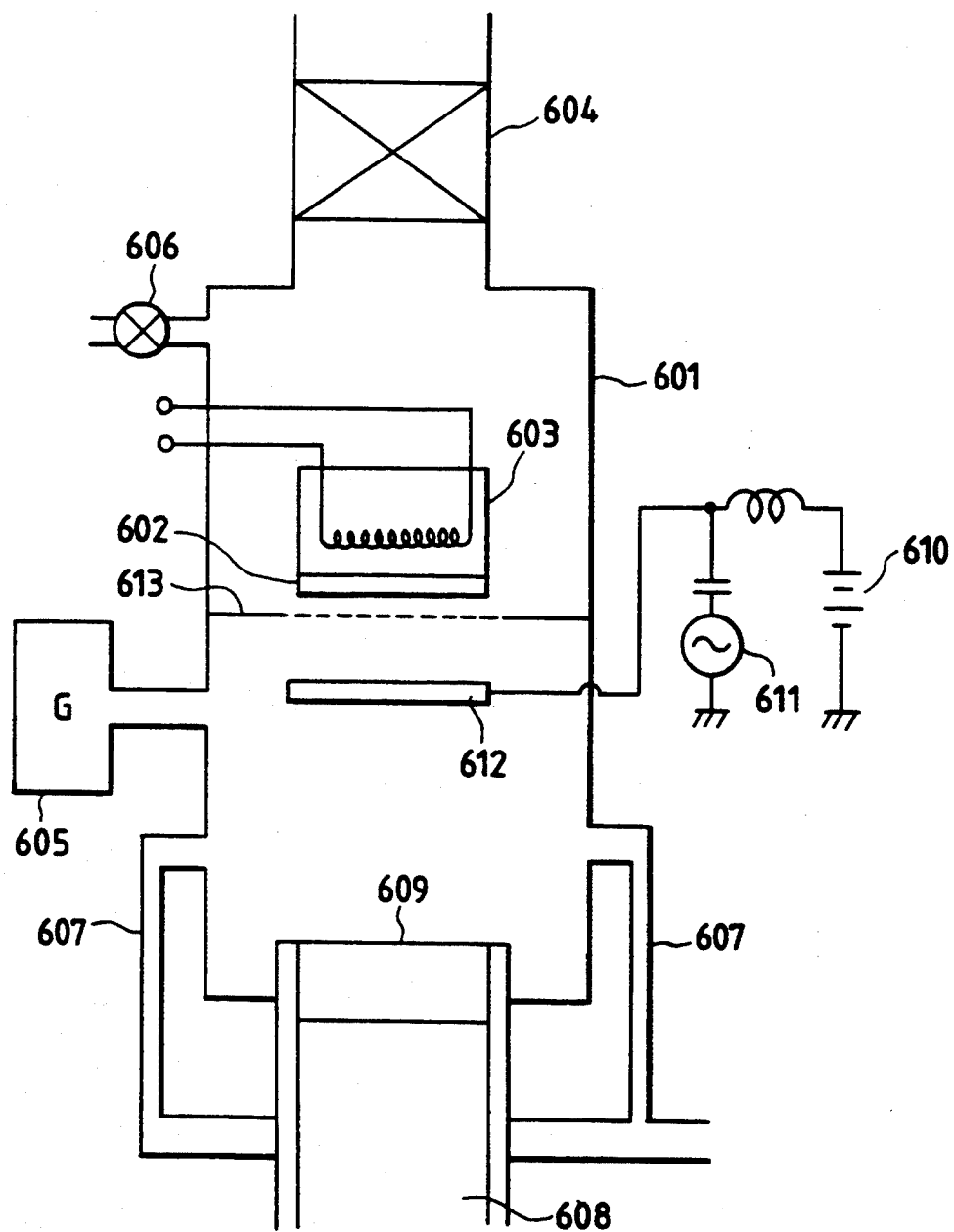
FIG. 6 is a conceptual view illustrating the arrangement of a μW plasma CVD apparatus as another means for realizing the present invention.

FIG. 6 is a view illustrating the arrangement of a $\mu W$ plasma CVD apparatus.

Referring to FIG. 6, a substrate 602 stored in a vacuum chamber 601 is mounted on a substrate heater 603 and is kept heated at a temperature of 150° C. or more and more preferably 200° C. or more during formation of the semiconductor layer. A vacuum pump (not shown) is connected to the vacuum chamber 601 through a conductance valve 604. An operator adjusts the degree of opening of the conductance valve 604 while checking a vacuum gauge 605 during supply of a semiconductor layer formation source gas, thereby setting the internal pressure of the vacuum chamber 601 to a desired pressure, i.e., 50 mTorr or less, and more preferably 20 mTorr or less. A leak valve 606 for atmospheric leakage is arranged in the vacuum chamber 601. $SiH_4$ as a preferable semiconductor layer formation source gas at a flow rate of 5 sccm to 500 sccm and $H_2$ gas at a flow rate of 0 sccm to 1 slm are supplied from a gas supply unit (not shown) to the vacuum chamber 601 through gas supply pipes 607. Hydrogen-diluted $B_2H_6$ gas (to be referred to as "$B_2H_6/H_2$" gas hereinafter) and hydrogen-diluted $PH_3$ gas (to be referred to as "$PH_3/H_2$" gas hereinafter) are selectively supplied from a gas supply unit (not shown) to the vacuum chamber 601 through the gas supply pipes 607. The ratio of the total flow rate of $B_2H_6$ gas and $PH_3$ gas to $SiH_4$ gas is determined in accordance with desired characteristics of a solar cell and semiconductor layer formation parameters and is preferably set within the range of 0.5% to 50%.

The $\mu W$ power supplied from a $\mu W$ power source (not shown) is supplied to the vacuum chamber 601 through a $\mu W$ waveguide portion 608 and a dielectric window 609 to generate a plasma. The semiconductor layer formation source gas supplied to the vacuum chamber 601 is decomposed and excited by the plasma to form a semiconductor layer on the substrate 602. The $\mu W$ power can be preferably set to 100 W or more, and more preferably 150 W or more. It is also possible to supply a sum of a DC bias of 0 V to 120 V from a DC power source 610 and an RF power (frequency: 13.56 MHz) of 0 W to 200 W to a bias application electrode 612. In addition, a mesh or mesh-like grid 613 detachable upon its rotation and made of a conductive metal is arranged between the substrate 602 and the bias application electrode 612. It is also possible to control formation of a semiconductor layer by arranging an arbitrarily movable shutter (not shown) in front of the substrate.

RF Plasma CVD

Figure 7:
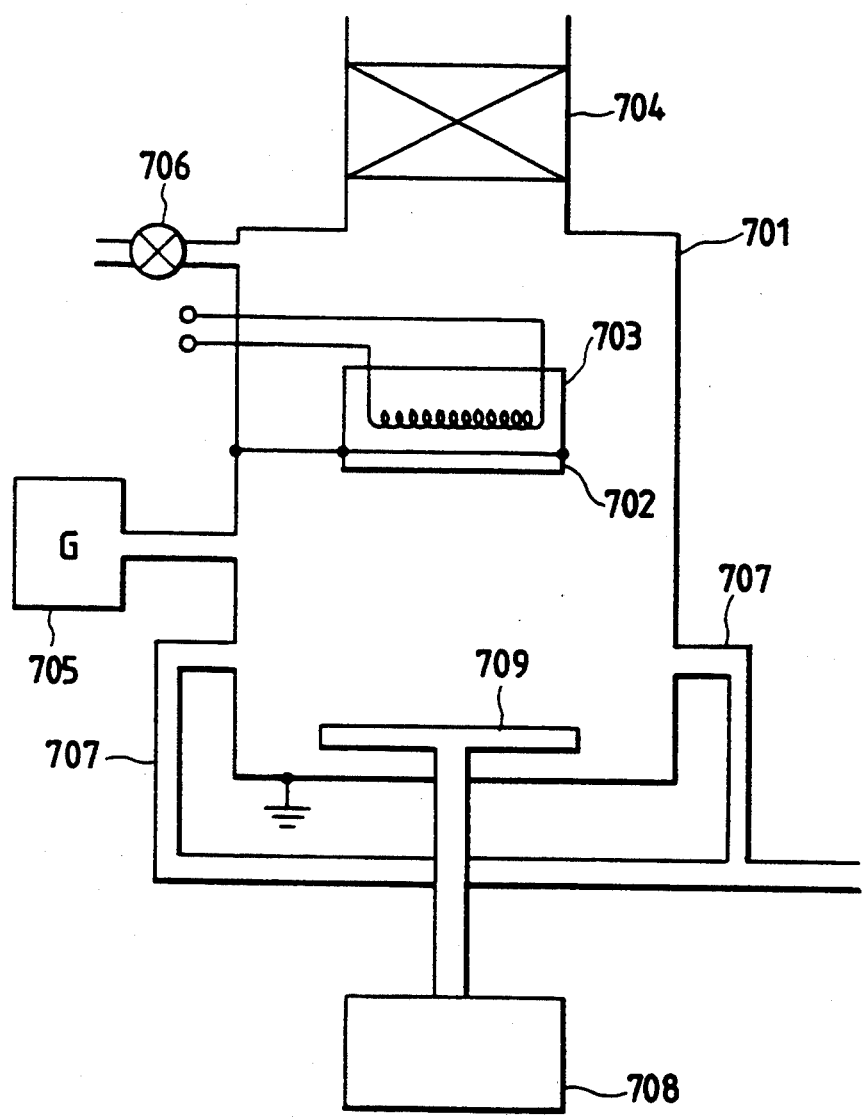
FIG. 7 is a conceptual view illustrating the arrangement of an RF plasma CVD apparatus as still another means for realizing the present invention.

FIG. 7 is a view illustrating the arrangement of an RF plasma CVD apparatus.

Referring to FIG. 7, a substrate 702 stored in a vacuum chamber 701 is mounted on a substrate heater 703 and is kept heated at a temperature of 100° C. or more and more preferably 150° C. or more during formation of the semiconductor layer. A vacuum pump (not shown) is connected to the vacuum chamber 701 through a conductance valve 704. An operator adjusts the degree of opening of the conductance valve 704 while checking a vacuum gauge 705 during supply of a semiconductor layer formation source gas, thereby setting the internal pressure of the vacuum chamber 701 to a desired pressure, i.e., 5 Torr or less, and more preferably 2 Torr or less. A leak valve 706 for atmospheric leakage is arranged in the vacuum chamber 701. $SiH_4$ as a preferable semiconductor layer formation source gas at a flow rate of 0.5 sccm to 50 sccm and $H_2$ gas at a flow rate of 5 sccm to 100 sccm are supplied from a gas supply unit (not shown) to the vacuum chamber 701 through gas supply pipes 707. $B_2H_6/H_2$ gas and $PH_3/H_2$ are selectively supplied from a gas supply unit (not shown) to the vacuum chamber 701 through the gas supply pipes 707. The ratio of the total flow rate of $B_2H_6$ gas and $PH_3$ gas to $SiH_4$ gas is determined in accordance with desired characteristics of a solar cell and semiconductor layer formation parameters and is preferably set within the range of 0.5% to 50%.

The RF power supplied from an RF power source or RF matching box 708 is supplied to the vacuum chamber 701 to generate an RF plasma between the grounded substrate heater 703 and substrate 702 and a flat plate electrode or cathode 709 parallel to the heater 703 and the substrate 702. The semiconductor layer formation source gas supplied to the vacuum chamber 701 is decomposed and excited by the RF plasma to form a semiconductor layer on the substrate 702. The RF power is preferably set to 1 $mW/cm^3$ or more, and more preferably 3 $mw/cm^3$ or more.

The present invention will now be described in more detail by way of examples, but is not limited by these examples.

EXAMPLE 1

An a-Si:H solar cell having the structure shown in FIG. 1 was manufactured as described below.

In Example 1, a conductive substrate 101 was prepared such that silver was deposited on a 0.1 mm thick 10 cm × 10 cm stainless (SUS 304) plate having a surface treated with mirror polishing to form a reflective conductive layer having a thickness of 0.3 $\mu$m by a known vacuum deposition method.

A zinc oxide layer 102 containing carbon atoms was formed using the planar DC magnetron sputtering apparatus shown in FIG. 5.

After a substrate 101 deposited with silver was mounted on a heating plate 503 as a substrate 508, the interior of the vacuum chamber 501 was evacuated by means of a vacuum pump (not shown). After the degree of vacuum in the vacuum chamber 501 was confirmed with a vacuum gauge 522/523 to be $10^{-5}$ Torr or less, heater 506 was turned on to heat the heating plate 503 at 400° C. under the control of a temperature controller 505.

In Example 1, target 510 was a baked powder of zinc oxide containing 3 atm % of carbon atoms. Argon gas as a sputtering gas was supplied while its flow rate was controlled to 24 sccm by a mass flow controller 520. After the flow rate of argon gas was stabilized, a DC voltage from the sputtering power source 516 was applied to the target 510 through a target table 512 so that the sputtering current was set to 0.3 A. The internal pressure during sputtering was maintained at 7 mTorr.

Formation of the zinc oxide layer was started as described above. When the thickness of the zinc oxide layer reached 1.0 $\mu$m, power supply from the sputtering power source was interrupted, supply of the sputtering gas was also interrupted, and the heater 506 was turned off. After the substrate was cooled, the vacuum chamber 501 was set at the atmospheric pressure, and the substrate having the zinc oxide layer thereon was unloaded.

An n-type semiconductor layer 103, an i-type semiconductor layer 104, and a p-type semiconductor layer 105 each consisting of a-Si:H were formed on the zinc oxide layer by using the $\mu$W plasma CVD apparatus shown in FIG. 6.

As described above, a substrate 602 having the zinc oxide layer containing carbon atoms was mounted on a substrate heater 603, and the interior of vacuum chamber 601 was evacuated by a vacuum pump (not shown). When the reading of vacuum gauge 605 became about $1 \times 10^{-4}$ Torr, the substrate heater 603 was switched on to heat the substrate heater 603 at 380° C.

A semiconductor layer formation source gas supply valve (not shown) was gradually opened to supply $SiH_4$ gas, $H_2$ gas, and $PH_3$ gas diluted with the $H_2$ gas to 10% (referred to as "$PH_3/H_2$ gas" hereinafter) to the vacuum chamber 601 through gas supply pipes 607. At this time, mass flow controllers (not shown) controlled the flow rates of the $SiH_4$ gas, $H_2$ gas, and $PH_3/H_2$ gas to be 10 sccm, 100 sccm, and 1.0 sccm, respectively.

When the flow rates of the gases were stabilized, the degree of opening of conductance valve 604 was adjusted while the internal pressure of the vacuum chamber 601 was adjusted to 5 mTorr with the vacuum gauge 605. A DC bias of +100 V was applied from a DC power source 610 to a bias application electrode 612. Thereafter, the power of the $\mu$W power source (not shown) was set to 400 W, and the $\mu$W power was supplied to the vacuum chamber 601 through a waveguide (not shown), a $\mu$W waveguide portion 608, and a dielectric window 609 to cause $\mu$W glow discharge, thereby starting formation of an n-type semiconductor layer 103 on the substrate 602.

When the thickness of the n-type semiconductor layer 103 became about 20 nm, supply of the $\mu$W power was interrupted, and the output of the DC power source 610 was disconnected. In addition, supply of the gases to the vacuum chamber 601 was interrupted to complete formation of the n-type semiconductor layer 103.

The i-type semiconductor layer 104 was formed as follows. The substrate 602 was kept heated at 250° C. by the substrate heater 603, and $SiH_4$ gas was supplied to the vacuum chamber 601 through the gas supply pipes 607 at a flow rate of 150 sccm. The degree of opening of the conductance valve 604 was adjusted while the internal pressure of the vacuum chamber 601 was adjusted to be 5 mTorr with the vacuum gauge 605. A rotatable mesh or mesh-like grid 613 was rotated to remove it from the area near the substrate 602. A combined DC bias of +60 V from the DC power source 610 and an RF power (frequency: 13.56 MHz) of 100 W from an RF power source 611 was applied to the bias application electrode 612. Thereafter, the power of a $\mu$W power source (not shown) was set to be 300 W, and the $\mu$W power was supplied to the vacuum chamber 601 through a waveguide (not shown), the $\mu$W waveguide portion 608, and the dielectric window 609 to cause $\mu$W glow discharge, thereby starting formation of the i-type semiconductor layer on the n-type semiconductor layer.

When the thickness of the i-type semiconductor layer 104 became about 400 nm, the supply of the $\mu$W power was stopped, and the output of the DC power source 610 and the RF power source 611 were interrupted. The supply of the gas to the vacuum chamber 601 was then interrupted, thereby completing formation of the i-type semiconductor layer 104.

The p-type semiconductor layer 105 was formed as follows. The substrate 602 was kept heated at 200° C. by the substrate heater 603, and $SiH_4$, $H_2$ gas, and $BF_3$ gas diluted with $H_2$ gas to 10% (referred to as "$BF_3/H_2$ gas" hereinafter) were supplied to the vacuum chamber 601 through gas supply pipes 607. At this time, respective mass controllers controlled the flow rates of the $SiH_4$, $H_2$, and $BF_3/H_2$ gases to be 10 sccm, 100 sccm, and 1.0 sccm, respectively. The degree of opening of the conductance valve 604 was adjusted while the internal pressure of the vacuum chamber 601 was adjusted to be 5 mTorr with the vacuum gauge 605. A DC bias of +100 V was applied from the DC power source 610 to the bias application electrode 612. Thereafter, the power of a $\mu$W power source (not shown) was set to 400 W, and the $\mu$W power was supplied to the vacuum chamber 601 through a waveguide (not shown), the $\mu$W waveguide portion 608, and the dielectric window 609 to cause a $\mu$W glow discharge, thereby starting formation of the p-type semiconductor layer on the i-type semiconductor layer.

When the thickness of the p-type semiconductor layer 105 reached about 10 nm, the supply of the $\mu$W power was interrupted, and the output of the DC power source 610 was disconnected. The supply of the gases to the vacuum chamber 601 was interrupted to complete formation of the p-type semiconductor layer 105.

The argon purge operation inside the vacuum chamber 601 and the gas supply pipes 607 was repeated three times, and the gas supply valve was closed. The leak valve 606 was opened to set the vacuum chamber 601 at atmospheric pressure. The substrate 602 having the n-, i-, and p-type semiconductor layers thereon was unloaded from the vacuum chamber 601.

A 75-nm thick ITO ($In_2O_3+SnO_2$) layer as a transparent electrode 107 was vacuum-deposited on the p-type semiconductor layer 105 of the a-Si:H solar cell formed as described above in accordance with known resistance heating vacuum deposition. A 2 $\mu$m thick Al layer as a collector electrode 108 was deposited by known resistance heating vacuum deposition, thereby forming the a-Si:H solar cell.

In addition, under the same conditions except that the density of carbon atoms in zinc oxide serving as a target in the planar DC magnetron sputtering method was variously changed to form different zinc oxide layers 102, a-Si:H solar cell samples were formed, and the dependencies of solar cell characteristics on the densities of carbon atoms in zinc oxide layers 102 formed on the corresponding conductive substrates 101 were examined as follows.

Figure 8:
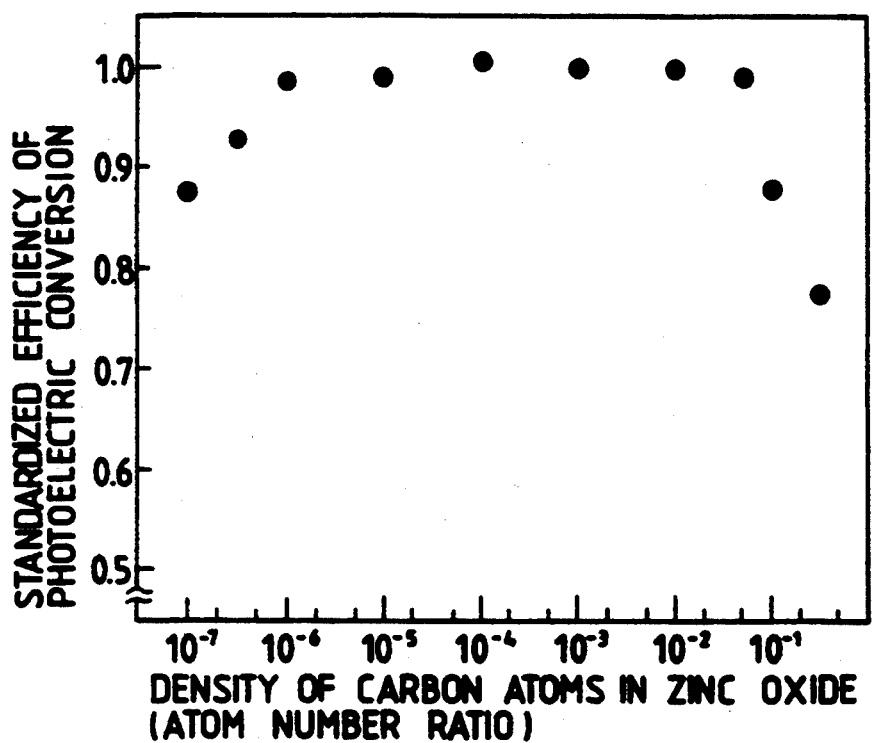
FIG. 8 is a graph showing the relationship between the density of carbon atoms contained in a zinc oxide layer of a solar cell manufactured by the method of Example 1 and the efficiency of photoelectric conversion thereof.

Using a solar simulator (YSS-150 available from Yamashita Denso K.K.), the current-voltage characteristics of these solar cell samples were measured under a pseudo sunlight (AM-1.5, 100 mW/$cm^2$), the densities of carbon atoms in the zinc oxide layers in the respective samples were measured with a SIMS, and the relationship between them was examined. Test results are summarized in FIG. 8. Each data point in FIG. 8 is normalized when the maximum value is defined as one.

The densities of carbon atoms in the zinc oxide layers in the respective solar cell samples were constant within the variation range of 10%.

As a comparative example, a solar cell sample having the same arrangement as described above was manufactured under the same conditions except that carbon atoms were not added in a zinc oxide layer. The efficiency of photoelectric conversion on the solar cell sample in the comparative example was 0.87 when the maximum value of all the solar cell samples of Example 1 was defined as 1. As is apparent from this fact, it is found that efficiency of the photoelectric conversion of the solar cells of Example 1 is improved. In a solar cell sample in which 5 atm % or less of carbon atoms were contained in the zinc oxide layer, the efficiency of photoelectric conversion is found to be greatly improved. The most improved factor in the solar cell having the improved efficiency of photoelectric conversion was examined. It is found that the series resistance in the solar cell element is greatly improved, thereby improving the efficiency of photoelectric conversion. It is assumed that this improvement is based on the fact that the carbon atoms doped in the zinc oxide layer effectively reduced the resistivity of the zinc oxide layer.

The following durability test of these solar cell samples was conducted to examine reliability under actual application conditions.

Figure 9:
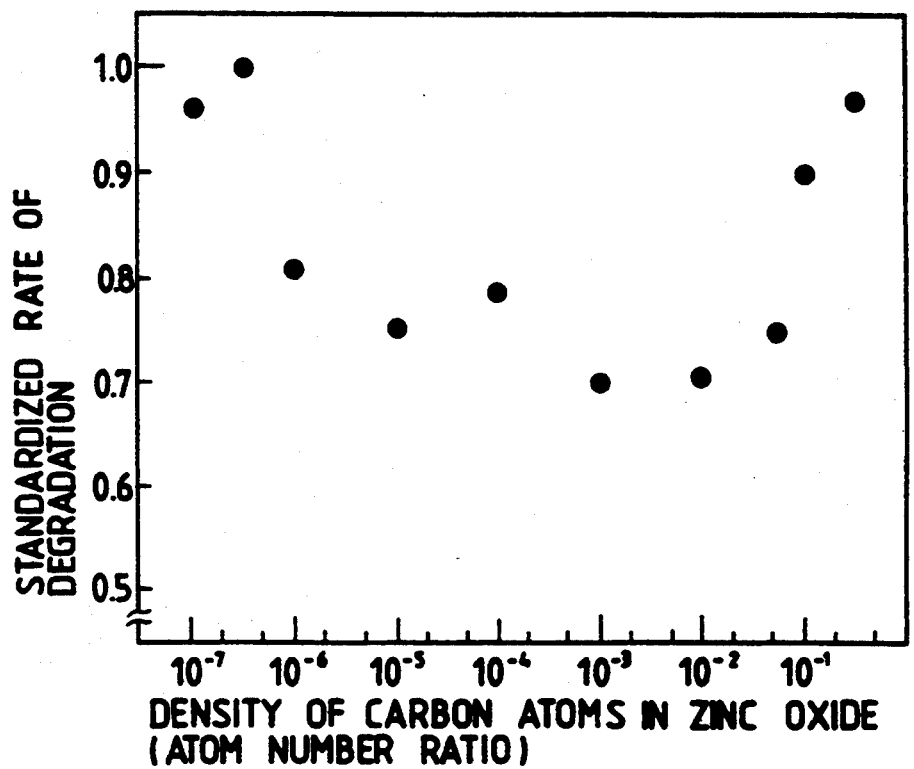
FIG. 9 is a graph showing the relationship between the density of carbon atoms contained in a zinc oxide layer of a solar cell manufactured by the method of Example 1 and the standardized rate of degradation thereof.

Each of the solar cell samples manufactured in Example 1 was hermetically sealed with a protective film consisting of polyvinylidene fluoride (PVF) and was placed under the actual application conditions (i.e., outdoor installation while fixed resistors each having a resistance of 50 $\Omega$ were connected to both electrodes of each sample) for one year, and the efficiency of photoelectric conversion was evaluated again. The rate of degradation (i.e., a value obtained by dividing the degraded efficiency value of photoelectric conversion by the initial efficiency value of photoelectric conversion) caused by light radiation, temperature differences, wind, rain, or the like was measured. Results obtained by standardizing or normalizing the resultant data are shown in FIG. 9. The rate of degradation of the solar cell sample of the Comparative Example was 1.22 times the minimum value of the data in FIG. 9. It is found that reliability of the solar cell can be greatly improved when carbon atoms are contained in the zinc oxide layer at a constant density falling within the range of 5 atm % or less.

EXAMPLE 2

As shown in FIG. 2, an a-Si:H solar cell having a structure in which zinc oxide layers 202 and 207 each containing carbon atoms were formed between a conductive substrate 201 and an n-type semiconductor layer 203 and between the p-type semiconductor layer and a transparent electrode 208, respectively, was manufactured as follows.

A 1 mm thick 10 cm×10 cm aluminum plate having a surface treated with mirror polishing was used as a conductive substrate 101 in Example 2. A zinc oxide layer 202 containing carbon atoms was formed on the conductive substrate 101 following the same procedures as in Example 1. An n-type semiconductor layer 203, an i-type semiconductor 204, and a p-type semiconductor layer 205 were formed on the zinc oxide layer 202 by the RF plasma CVD apparatus shown in FIG. 7 in accordance with a method to be described below.

After a substrate 702 on which a zinc oxide layer containing carbon atoms was formed was mounted on a substrate heater 703, the interior of the vacuum chamber 701 was evacuated by means of a vacuum pump (not shown). When the reading of a vacuum gauge 705 reached about $1 \times 10^{-4}$ Torr, the substrate heater 703 was switched on to keep the substrate at 300° C.

A semiconductor layer formation source gas supply valve (not shown) was gradually opened to supply $SiH_4$ gas, $H_2$ gas, and $PH_3/H_2$ gas to the vacuum chamber 701 through the gas supply pipes 707. At this time, mass flow controllers (not shown) controlled the flow rates of the $SiH_4$, $H_2$, and $PH_3/H_2$ gases to be 2 sccm, 50 sccm, and 1.0 sccm, respectively. The degree of opening of the conductance valve 704 was adjusted while the internal pressure of the vacuum chamber 701 was adjusted to be 1 Torr with the aid of vacuum gauge 705.

When the internal pressure of the vacuum chamber 701 was stabilized, the power of an RF power source (not shown) was set to 200 mW/cm$^3$, and the RF power was supplied to a flat plate electrode or cathode 709 through an RF power supply or RF matching box 708 to cause RF glow discharge, thereby starting formation of the n-type semiconductor layer 203 on the zinc oxide layer 202.

When the thickness of the n-type semiconductor layer reached 5 nm, the RF glow discharge was stopped, and the supply of the gases to the vacuum chamber 701 was interrupted, thereby completing formation of the n-type semiconductor layer 203.

The i-type semiconductor layer 204 was formed on the n-type semiconductor layer 203 as follows. The substrate 702 was kept heated at 280° C. by the substrate heater 703, and the $SiH_4$ gas and $H_2$ gas were supplied to the vacuum chamber 701 through the gas supply pipes 707 at flow rates of 2 sccm and 20 sccm, respectively. At this time, the degree of opening of the conductance valve 704 was adjusted while the internal pressure of the vacuum chamber 701 was set to be 1 Torr with the vacuum gauge 705. Thereafter, the power of an RF power source (not shown) was set to be 5 mW/cm$^3$, and the RF power was supplied to the cathode 709 through the RF matching box 708 to cause RF glow discharge, thereby starting formation of the i-type semiconductor layer 204 on the n-type semiconductor layer 203.

When the thickness of the i-type semiconductor layer 204 reached 400 nm, the RF glow discharge and supply of the gases were stopped, thereby completing formation of the i-type semiconductor layer 204.

The p-type semiconductor layer 205 was formed on the i-type semiconductor layer 204 as follows. The substrate 702 was kept heated at 250° C. by the substrate heater 703, and $SiH_4$ gas, $H_2$ gas, and $B_2H_6/H_2$ gas were supplied to the vacuum chamber 701 through the gas supply pipes 707. At this time, mass flow controllers controlled the flow rates of the $SiH_4$, $H_2$, and $B_2H_6/H_2$ gases to be 2 sccm, 20 sccm, and 1.0 sccm, respectively. The degree of opening of the conductance valve 704 was adjusted while the internal pressure of the vacuum chamber 701 was set to be 1 Torr with the vacuum gauge 705. Thereafter, the power of an RF power source (not shown) was set to 10 mW/cm$^3$, and the RF power was supplied to the cathode 709 through the RF matching box 708 to cause RF glow discharge, thereby starting formation of the p-type semiconductor layer 205 on the i-type semiconductor layer 204.

When the thickness of the p-type semiconductor layer 205 reached 10 nm, the RF glow discharge and supply of the gases were stopped, thereby completing formation of the p-type semiconductor layer 205.

Upon completion of formation of the p-type semiconductor layer 205, an argon purge operation inside the vacuum chamber 701 and the gas supply pipes 707 was repeated three times, and the gas supply valve was closed. Leak valve 706 was opened to set the vacuum chamber 701 at the atmospheric pressure, and the substrate 702 having the n-, i-, a p-type semiconductor layers thereon was unloaded from the vacuum chamber 701.

A zinc oxide layer 207 containing carbon atoms was formed on the p-type semiconductor layer 205 following the same procedures as in formation of the zinc oxide layer 202 except that the temperature of the heating plate 503 was set to 230° C.

Subsequently, a transparent electrode 208 and a collector electrode 209 were formed on the zinc oxide layer 207 following the same procedures as in Example 1, thereby manufacturing the a-Si:H solar cell.

This a-Si:H solar cell was tested following the same procedures as in Example 1.

The densities of carbon atoms contained in zinc oxide layers of the solar cell samples manufactured in Example 2 were kept constant at 3 atm % with variation falling within the range of 10%.

Of all the solar cell samples manufactured in Example 1, the one having almost the same density of carbon atoms in the zinc oxide layer as that of the sample of Example 2 was compared with the sample of Example 2. As a result, the efficiency of photoelectric conversion and the rate of degradation of the solar cell sample having the zinc oxide layers on both sides of the semiconductor layer, i.e., the solar cell sample manufactured in Example 2 were 0.98 and 0.95, respectively, when the efficiency of photoelectric conversion and the rate of degradation of the solar cell sample having the zinc oxide layer on only the substrate side of the semiconductor layer, i.e., the solar cell sample manufactured in Example 1 were defined as 1.

As a result, it is found that the solar cell sample having the zinc oxide layers containing carbon atoms on both sides of the semiconductor layer, manufactured in Example 2, has higher reliability than the solar cell sample having the zinc oxide layer on one side, although the sample in Example 2 is inferior in initial efficiency to the sample in Example 1.

EXAMPLE 3

Ion plating was used in the formation of a zinc oxide layer in Example 3.

In the formation of a zinc oxide layer according to the ion plating, the source material was zinc metal (purity: 99.9%), and a molybdenum metal boat was used because zinc is a sublimable metal. An RF power of 13.56 MHz was applied to the L-coupled electrode assembly. The gas used in this example was a mixture of oxygen and carbon dioxide (the content of carbon dioxide with respect to oxygen was 5%).

An a-Si:H solar cell was manufactured following the same procedure as in Example 1 except for the above differences, and the solar cell sample was subjected to the measurement following the same procedures as in Example 1.

The content of carbon atoms contained in the zinc oxide layer of the solar cell sample manufactured in Example 3 was constant at 2 atm %.

Of the solar cell samples manufactured in Example 1, the one having almost the same content of carbon atoms in the zinc oxide layer as the sample of Example 3 was compared with the sample of Example 3. The efficiency of photoelectric conversion and the rate of degradation of the solar cell sample manufactured in Example 1 were defined as 1.

EXAMPLE 4

As shown in FIG. 3, a transparent electrode 302, a zinc oxide layer 303 containing carbon atoms, a p-type semiconductor layer 304, an i-type semiconductor layer 305, an n-type semiconductor layer 306, a zinc oxide layer 308 containing carbon atoms, and a lower electrode 309 were sequentially formed on a glass substrate 301 to obtain an a-Si:H solar cell sample. A Corning #7059 glass substrate having polished surfaces was used as the glass substrate 301. The transparent electrode 302 and the lower electrode 309 made of tin oxide ($SnO_2$) films were formed by standard vacuum thermal deposition. The zinc oxide layers 303 and 308 containing the carbon atoms were formed by normal RF sputtering. The respective semiconductor layers were formed by RF plasma CVD. The content of carbon atoms contained in each of the zinc oxide layers 303 and 308 was measured by a SIMS to be constant at 3 atm %. An a-Si:H solar sell sample without the zinc oxide layers 303 and 308 containing carbon atoms was manufactured as a Comparative Example with respect to the a-Si:H solar cell sample manufactured in Example 4.

The characteristics of these solar cell samples were measured following the same procedures as in Example 1. As a result, the solar cell sample of Example 4 had an efficiency of photoelectric conversion 1.10 times and a rate of degradation 0.85 times those of the solar cell sample of the Comparative Example.

EXAMPLE 5

A solar cell sample having the structure shown in FIG. 1 was manufactured following the same procedures as in Example 1 except for the method of forming a zinc oxide layer 102.

The zinc oxide layer 102 containing carbon atoms whose density was continuously changed was formed on a conductive substrate 101 having a reflective conductive layer thereon, by using the DC planar magnetron sputtering apparatus shown in FIG. 5 in the following manner.

After a substrate 508 deposited with silver was mounted on a heating plate 503, the interior of the vacuum chamber 501 was evacuated by means of a vacuum pump (not shown). After the degree of vacuum in the vacuum chamber 501 was confirmed with a vacuum gauge 522/523 to be $10^{-5}$ Torr or less, heater 506 was switched on to heat the heating plate 503 to 400° C. under the control of a temperature controller 505.

In Example 5, the target 510 was a baked powder of zinc oxide containing 3 atm % of carbon atoms. Argon gas as a sputtering gas was supplied while its flow rate was controlled to be 24 sccm by a mass flow controller 520.

After the flow rate of argon gas was stabilized, a DC voltage from the sputtering power source was applied to the target 510 through a target table 512 so that the sputtering current was set to 0.3 A. The internal pressure during sputtering was maintained at 7 mTorr.

After formation of the zinc oxide layer was started as described above, the sputtering power source was adjusted to gradually increase the sputtering current with a continuous increase in DC voltage. When the thickness of the zinc oxide layer reached 1.0 $\mu$m, the sputtering current was 0.5 A. When the thickness of the zinc oxide layer reached 1.0 $\mu$m, power supply from the sputtering power source was interrupted, the supply of the sputtering gas was also interrupted, and the heater 506 was turned off. After the substrate was cooled, the vacuum chamber 501 was set at atmospheric pressure, and the substrate having the zinc oxide layer thereon was unloaded.

In addition, a-Si:H solar cell samples were manufactured under the same conditions as in Example 1 except that zinc oxide layers 102 were formed by variously changing the density of carbon atoms in zinc oxide serving as the target in the DC planar magnetron sputtering apparatus, and the dependency of solar cell characteristics on the density of carbon atoms in each zinc oxide layer 102 formed on the corresponding substrate 101 was examined.

Figure 10:
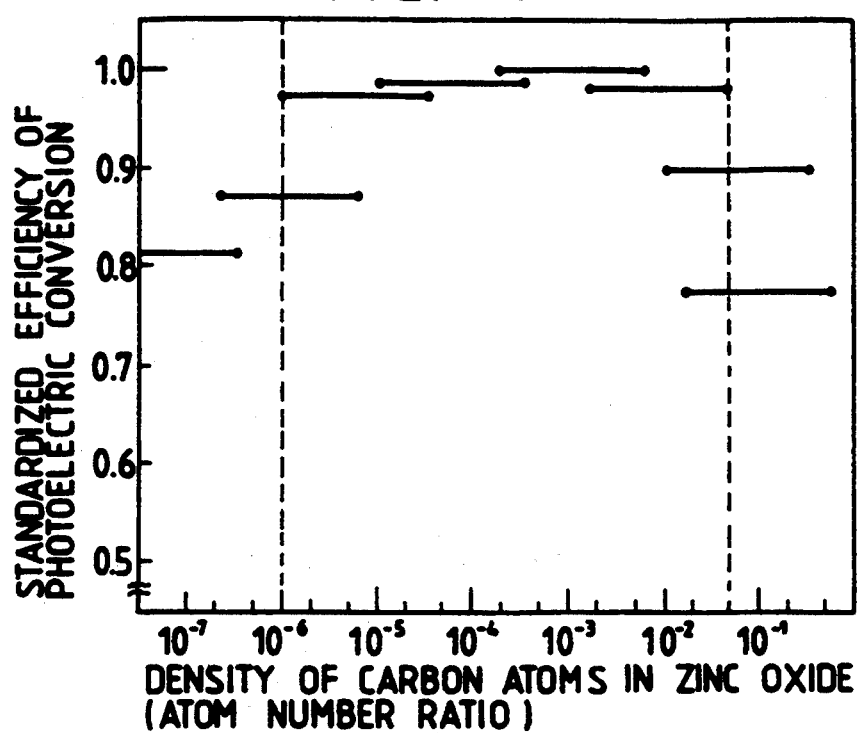
FIG. 10 is a graph showing the relationship between the density of carbon atoms contained in a zinc oxide layer of a solar cell manufactured by the method of Example 5 and the efficiency of photoelectric conversion thereof.

Using a solar simulator (YSS-150 available from Yamashita Denso), the current-voltage characteristics of these solar cell samples were measured under pseudo sunlight (AM-1.5, 100 mW/cm$^2$), the densities of carbon atoms in the zinc oxide layers in the respective samples were measured with a SIMS, and the relationship between them was examined. Test results are summarized in FIG. 10. The length of each bar represents the width of the density distribution.

In each solar cell sample, the ratio of the density of carbon atoms at the start of formation of the zinc oxide film to the density of carbon atoms immediately before the end of film formation was about 30.

When the efficiency of photoelectric conversion of the solar cell sample of Example 5 was defined as one, the efficiency of photoelectric conversion of the solar cell sample formed in Example 1 without changing the DC voltage and hence the sputtering current during formation of the zinc oxide layer by DC magnetron sputtering was 0.94.

Judging from these test results, it is found that the efficiency of photoelectric conversion can be further improved in a solar cell sample wherein its zinc oxide layer contains carbon atoms and their density is continuously changed within the range of 5 atm % or less.

Figure 11:
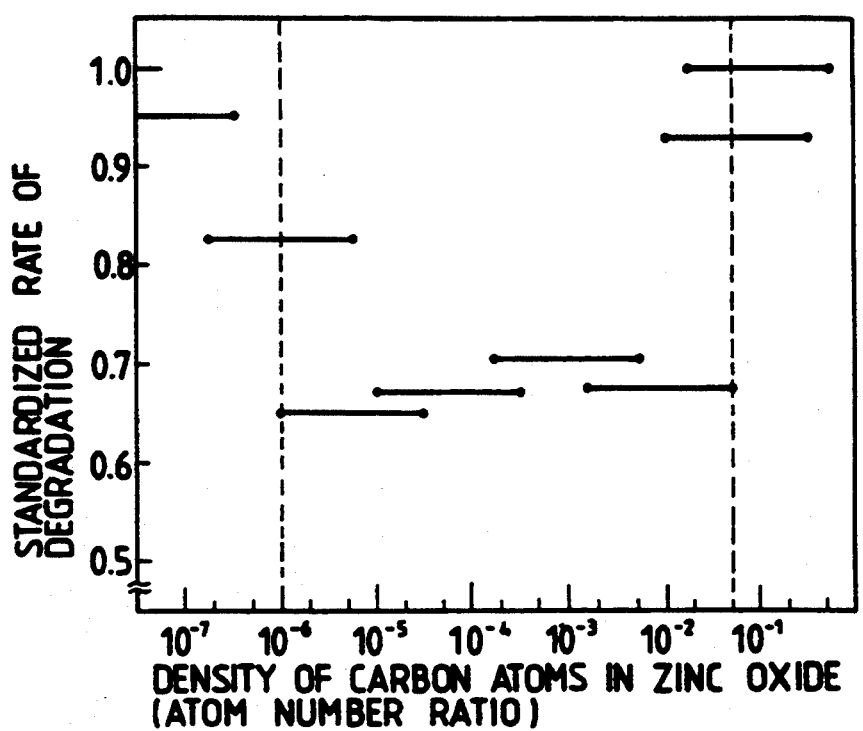
FIG. 11 is a graph showing the relationship between the density of carbon atoms contained in a zinc oxide layer of a solar cell manufactured by the method of Example 5 and the standardized rate of degradation thereof.

Each solar cell sample manufactured in Example 5 was hermetically sealed with a protective film consisting of polyvinylidene fluoride (PVF) and was placed under actual application conditions for one year, and the rate of degradation of the efficiency of photoelectric conversion was measured. Results are shown in FIG. 11. The length of each bar represents the width of the density distribution.

As shown in FIG. 11, a solar cell sample in which a zinc oxide layer contains carbon atoms and their density is continuously changed within the range of 5 atm % or less has greatly improved reliability, but the reason for this improvement is not yet clarified.

However, it is assumed that the structure in the zinc oxide layer is changed due to the density distribution of carbon atoms in the zinc oxide layer to effectively relax stresses generated upon formation of different types of deposition films on both sides of the zinc oxide layer and external stresses, thereby effectively preventing film peeling which may occur during the manufacture or in actual application conditions in conventional solar cells.

EXAMPLE 6

As shown in FIG. 2, an a-Si:H solar cell having a structure in which zinc oxide layers 202 and 207 each containing carbon atoms were formed between a conductive substrate 201 and an n-type semiconductor layer 203 and between the p-type semiconductor layer and a transparent electrode 208, respectively, was manufactured following the same procedures as in Example 2, except for the method of forming the zinc oxide layers 202 and 207. The zinc oxide layer 202 was formed as in Example 5, while the transparent electrode 208 was formed such that the temperature of the heating plate 503 was set to 230° C., and the direction of change in the DC power source and hence sputtering current was opposite to that for the zinc oxide layer 202, i.e., from 0.5 A to 0.3 A.

The solar cell sample was subjected to measurement following the same procedures as in Example 5.

In the solar cell sample manufactured in Example 6, the density of carbon atoms in each of the two zinc oxide layers was continuously changed from 100 atm. ppm to 0.3 atm %. The same results as in Example 5 were obtained except for the direction of change.

Of all the solar cell samples manufactured in Example 5, the one having almost the same density of carbon atoms in the zinc oxide layer as that of the sample of Example 6 was compared with the sample of Example 6. As a result, the efficiency of photoelectric conversion and the rate of degradation of the solar cell sample having the zinc oxide layers on both sides of the semiconductor layer, i.e., the solar cell sample manufactured in Example 6 were 0.97 and 0.92, respectively, when the efficiency of photoelectric conversion and the rate of degradation of the solar cell sample having the zinc oxide layer on only the substrate side of the semiconductor layer, i.e., the solar cell sample manufactured in Example 5 were defined as 1.

As a result, it is found that the solar cell sample having the zinc oxide layers containing carbon atoms on both sides of the semiconductor layer, manufactured in Example 6, has higher reliability than the solar cell sample having the zinc oxide layer on one side, although the sample in Example 6 is inferior in initial efficiency to the sample in Example 6.

EXAMPLE 7

Ion plating was used in the formation of a zinc oxide layer in Example 7. In order to provide a desired distribution to the density of carbon atoms in the zinc oxide layer, the content of carbon dioxide gas of the gases used in formation of the zinc oxide layer was changed from 0.5% to 10% from the start of formation of the zinc oxide layer to the end thereof.

An a-Si:H solar cell sample as shown in FIG. 1 was manufactured following the same procedures as in Example 3 and was subjected to measurement following the same procedures as in Example 1.

In the solar cell sample manufactured in Example 7, the density of carbon atoms in each of the two zinc oxide layers was continuously changed from 800 atm. ppm to 0.3 atm %.

Of all the solar cell samples manufactured in Example 5, the one having almost the same density of carbon atoms in the zinc oxide layer as that of the sample of Example 7 was compared with the sample of Example 7. As a result, the efficiency of photoelectric conversion and the rate of degradation of the solar cell sample manufactured in Example 7 were 1.06 and 0.91, respectively, when the efficiency of photoelectric conversion and the rate of degradation of the solar cell sample manufactured in Example 5 were defined as 1.

EXAMPLE 8

A solar cell sample having the structure shown in FIG. 3 was manufactured following the same procedures as in Example 4 except for the method of forming a zinc oxide layer. The zinc oxide layers 303 and 308 were formed following the same method as in Example 6.

In the solar cell sample manufactured in Example 8, the density of carbon atoms in each of the two zinc oxide layers was continuously changed from 0.1 atm % to 0.3 atm %.

An a-Si:H solar cell sample was manufactured following the same procedures as in Example 8 as a comparative example with respect to the solar cell sample of Example 8, except that the zinc oxide layers 303 and 308 containing carbon atoms were not formed.

The characteristics of these solar cell samples were measured following the same procedures as in Example 1. As a result, the solar cell sample of Example 8 had an efficiency of photoelectric conversion 1.15 times and a rate of degradation 0.83 times those of the solar cell sample of the Comparative Example.

EXAMPLE 9

A zinc oxide layer containing nitrogen atoms was formed in place of the zinc oxide layer containing carbon atoms in Example 1, following the same procedures as in Example 1 except that the target 510 was a baked powder of zinc oxide containing 3 atm % of nitrogen atoms.

Tests were conducted replacing the carbon atoms of Example 1 with nitrogen atoms.

Figure 12:
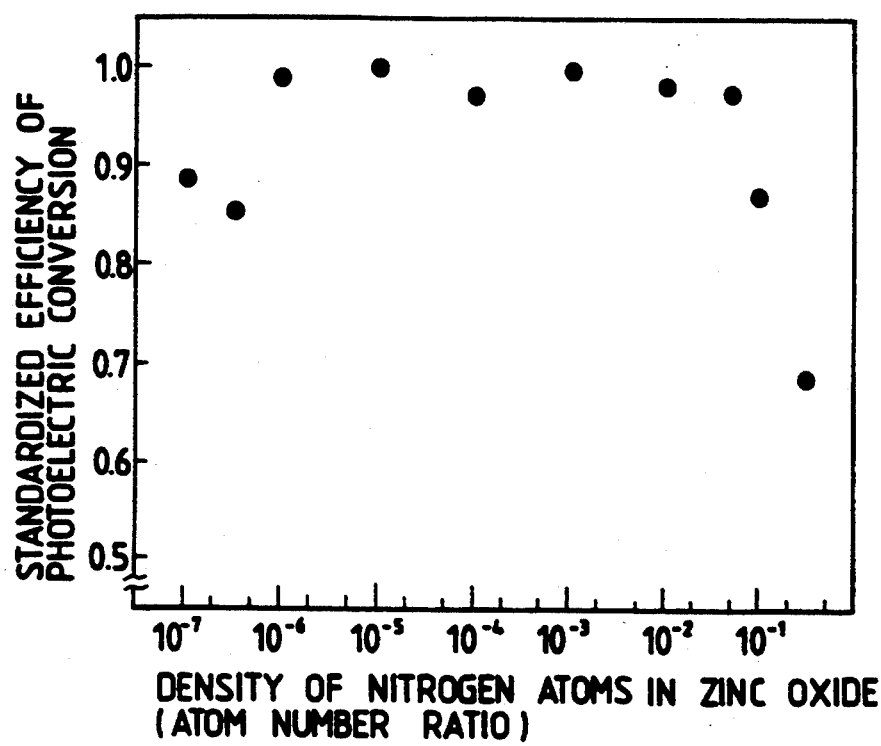
FIG. 12 is a graph showing the relationship between the density of carbon atoms contained in a zinc oxide layer of a solar cell manufactured by the method of Example 9 and the efficiency of photoelectric conversion thereof.

Using a solar simulator (YSS-150 available from Yamashita Denso), the current-voltage characteristics of these solar cell samples were measured under a pseudo sunlight (AM-1.5, 100 mW/cm$^2$), the densities of nitrogen atoms in the zinc oxide layers in the respective samples were measured with a SIMS, and the relationship between them was examined. Test results are summarized in FIG. 12. Each data in FIG. 12 is normalized when the maximum value is defined as 1.

The densities of nitrogen atoms in the zinc oxide layers in the respective solar cell samples were constant within the variation range of 10%.

As a comparative example, a solar cell sample having the same arrangement as described above was manufactured under the same conditions except that nitrogen atoms were not added to the zinc oxide layer. The efficiency of photoelectric conversion of the solar cell sample in the comparative example was as low as 0.92 when the maximum value of all the solar cell samples of Example 9 was defined as 1.

Figure 13:
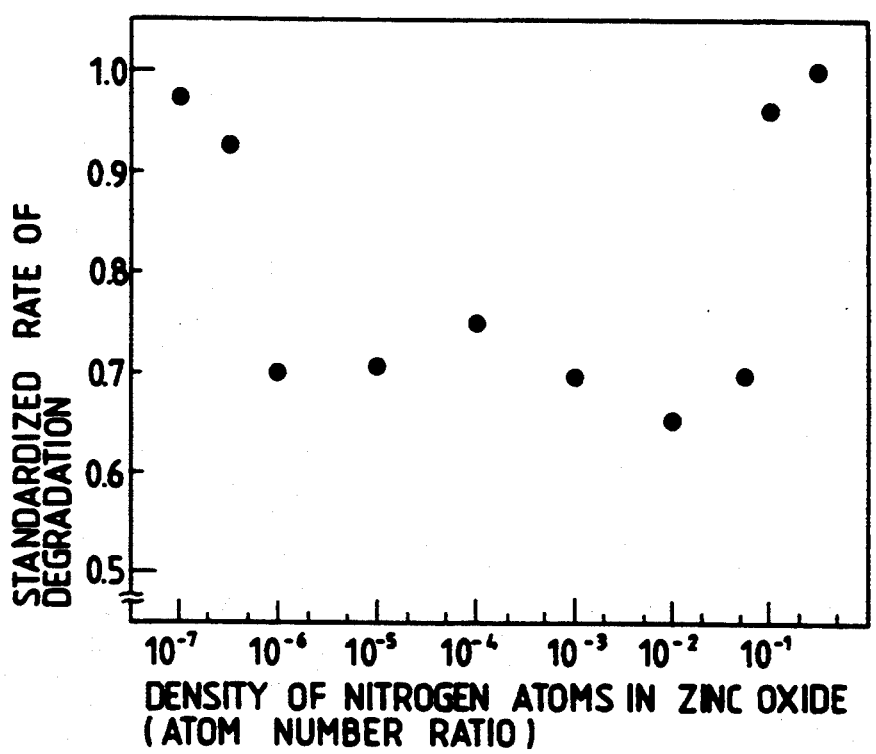
FIG. 13 is a graph showing the relationship between the density of carbon atoms contained in a zinc oxide layer of a solar cell manufactured by the method of Example 9 and the standardized rate of degradation thereof.

As in Example 1, each of the solar cell samples manufactured in Example 9 was hermetically sealed with a protective film consisting of polyvinylidene fluoride (PVF) and was placed under the actual application conditions (i.e., outdoor installation while fixed resistors each having a resistance of 50 Ω were connected to both the electrodes of each sample) for one year, and efficiency of photoelectric conversion was evaluated again. The rate of degradation (i.e., a value obtained by dividing the degraded efficiency value of photoelectric conversion by the initial efficiency value of photoelectric conversion) caused by light radiation, temperature differences, wind and rain, or the like was measured. Results obtained by normalizing the resultant data are shown in FIG. 13. The rate of degradation of the solar cell sample of the Comparative Example was 1.19 times the minimum value of the data in FIG. 13. It is found that reliability of the solar cell can be greatly improved when nitrogen atoms are contained in the zinc oxide layer at a constant density falling within the range of 5 atm % or less.

EXAMPLE 10

The same conditions as in Example 2 were established except that carbon atoms were replaced with nitrogen atoms. As a result, the densities of nitrogen atoms contained in zinc oxide layers of the solar cell samples manufactured in Example 10 were kept constant at 3 atm % with variations falling within the range of 10%.

Of all the solar cell samples manufactured in Example 9, the one having almost the same density of nitrogen atoms in the zinc oxide layer as that of the sample of Example 10 was compared with the sample of Example 10. As a result, the efficiency of photoelectric conversion and the rate of degradation of the solar cell sample having the zinc oxide layers on both sides of the semiconductor layer, i.e., the solar cell sample manufactured in Example 10 were 0.97 and 0.91, respectively, when the efficiency of photoelectric conversion and the rate of degradation of the solar cell sample having the zinc oxide layer on only the substrate side of the semiconductor layer, i.e., the solar cell sample manufactured in Example 9 were defined as 1.

As a result, it is found that the solar cell sample having the zinc oxide layers containing nitrogen atoms on both sides of the semiconductor layer, manufactured in Example 10. has higher reliability than the solar cell sample having the zinc oxide layer on one side, although the sample in Example 10 is inferior in initial efficiency to the sample in Example 9.

EXAMPLE 11

The same conditions as in Example 3 were used except that the carbon atoms were replaced with nitrogen atoms and a gas mixture of oxygen gas and nitrogen gas (content of nitrogen gas with respect to oxygen gas was 5%) was used.

In the solar cell sample manufactured in Example 11, the density of nitrogen atoms in the zinc oxide layer was constant at 2 atm %.

Of all the solar cell samples manufactured in Example 9, the one having almost the same density of nitrogen atoms in the zinc oxide layer as that of the sample of Example 11 was compared with the sample of Example 11. As a result, the efficiency of photoelectric conversion and the rate of degradation of the solar cell sample manufactured in Example 11 were 1.09 and 0.97, respectively, when the efficiency of photoelectric conversion and the rate of degradation of the solar cell sample manufactured in Example 9 were defined as 1.

EXAMPLE 12

The same conditions as in Example 4 were established except that the carbon atoms were replaced with nitrogen atoms.

The densities of nitrogen atoms in the zinc oxide layers 303 and 308 in the respective samples were measured with a SIMS to be constant at 3 atm %.

An a-Si:H solar cell sample was manufactured following the same procedures as in Example 12 as a comparative example with respect to the solar cell sample of Example 12, except that the zinc oxide layers 303 and 308 containing nitrogen atoms were not formed. The characteristics of these solar cell samples were measured following the same procedures as in Example 9. As a result, the solar cell sample of Example 12 had an efficiency of photoelectric conversion 1.12 times and a rate of degradation 0.88 times those of the solar cell sample of the Comparative Example.

EXAMPLE 13

The same conditions as in Example 5 were established except that the carbon atoms were replaced with nitrogen atoms.

Figure 14:
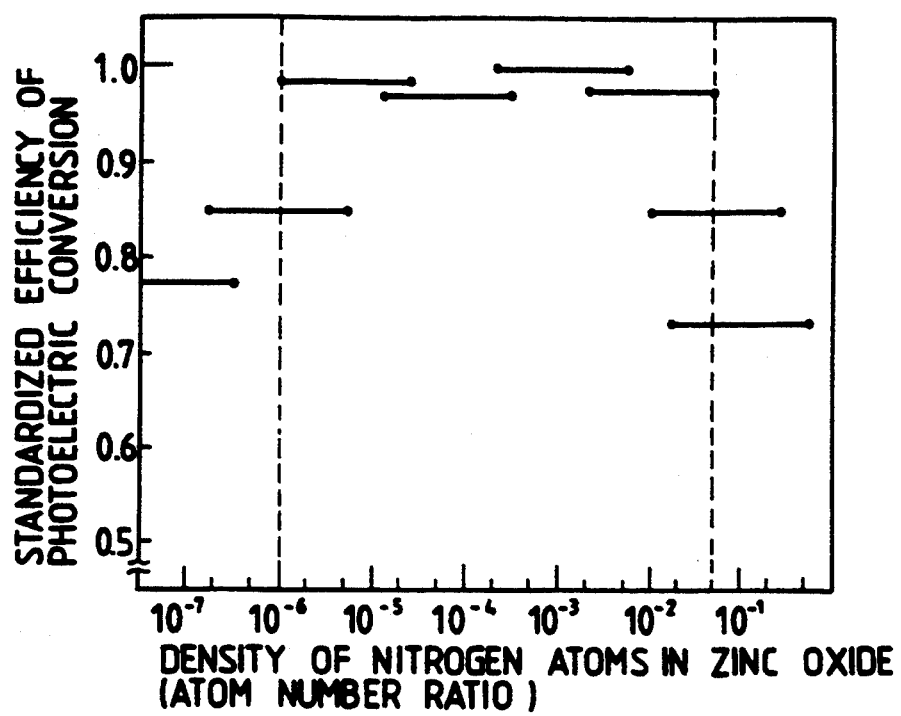
FIG. 14 is a graph showing the relationship between the density of carbon atoms contained in a zinc oxide layer of a solar cell manufactured by the method of Example 13 and the efficiency of photoelectric conversion thereof.

Using a solar simulator (YSS-150 available from Yamashita Denso), the current-voltage characteristics of these solar cell samples were measured under pseudo sunlight (AM-1.5, 100 mW/cm$^2$), the densities of nitrogen atoms in the zinc oxide layers in the respective samples were measured with a SIMS, and the relationship between them was examined. Test results are summarized in FIG. 14. The length of each bar represents the width of the density distribution.

In each solar cell sample, the ratio of the density of nitrogen atoms at the start of formation of the zinc oxide film to the density of nitrogen atoms immediately before the end of film formation was about 25 to 30.

When the efficiency of photoelectric conversion of the solar cell sample of Example 13 was defined as 1, the efficiency of photoelectric conversion of the solar cell sample formed in Example 9 without changing the DC voltage and hence the sputtering current in formation of the zinc oxide layer by DC magnetron sputtering was 0.95.

Judging from these test results, the efficiency of photoelectric conversion can be further improved in the solar cell sample when its zinc oxide layer contains nitrogen atoms and their density is continuously changed within the range of 5 atm % or less.

Figure 15:
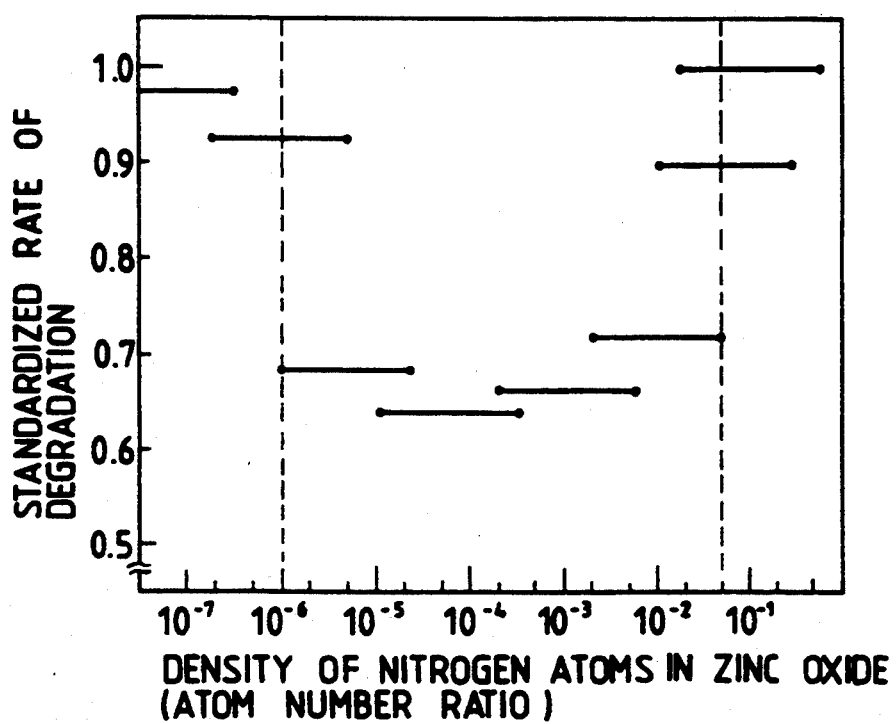
FIG. 15 is a graph showing the relationship between the density of carbon atoms contained in a zinc oxide layer of a solar cell manufactured by the method of Example 13 and the standardized rate of degradation thereof.

Each solar cell sample manufactured in Example 13 was hermetically sealed with a protective film consisting of polyvinylidene fluoride (PVF) and was placed under the actual application condition for one year, and the rate of degradation in the efficiency of photoelectric conversion was measured. Results are shown in FIG. 15. The length of each bar represents the width of the density distribution.

As shown in FIG. 15, a solar cell sample in which a zinc oxide layer contains nitrogen atoms and their density is continuously changed within the range of 5 atm % or less has greatly improved reliability, but the reason for this improvement is not yet clarified. However, it is assumed that the structure in the zinc oxide layer is changed due to the density distribution of nitrogen atoms in the zinc oxide layer to effectively relax stresses generated upon formation of different types of deposition films on both sides of the zinc oxide layer and external stresses, thereby minimizing film peeling which may occur during the manufacture or in actual application conditions in conventional solar cells.

EXAMPLE 14

The same conditions as in Example 6 were established except that the carbon atoms were replaced with nitrogen atoms.

In the solar cell sample manufactured in Example 14, the density of nitrogen atoms in each of the two zinc oxide layers are continuously changed from 200 atm. ppm to 0.5 atm %.

Of all the solar cell samples manufactured in Example 13, the one having almost the same density of nitrogen atoms in the zinc oxide layer as that of the sample of Example 13 was compared with the sample of Example 14. As a result, the efficiency of photoelectric conversion and the rate of degradation of the solar cell sample having the zinc oxide layers on both sides of the semiconductor layer, i.e., the solar cell sample manufactured in Example 14 were 0.96 and 0.91, respectively, when the efficiency of photoelectric conversion and the rate of degradation of the solar cell sample having the zinc oxide layer on only the substrate side of the semiconductor layer, i.e., the solar cell sample manufactured in Example 13 were defined as 1.

As a result, it is found that the solar cell sample having the zinc oxide layers containing nitrogen atoms on both sides of the semiconductor layer, manufactured in Example 14, has higher reliability than the solar cell sample having the zinc oxide layer on one side, although the sample in Example 14 is inferior in initial efficiency to the sample in Example 13.

EXAMPLE 15

Ion plating was used in the formation of the zinc oxide layer in Example 15. In order to provide a desired distribution to the density of nitrogen atoms in the zinc oxide layer, the content of nitrogen gas of the gases used in formation of the zinc oxide layer was changed from 1.0% to 20% from the start of formation of the zinc oxide layer to the end thereof.

An a-Si:H solar cell sample as shown in FIG. 1 was manufactured following the same procedures as in Example 3 and was subjected to measurement following the same procedures as in Example 1.

In the solar cell sample manufactured in Example 15, the density of nitrogen atoms in each of the two zinc oxide layers was continuously changed form 100 atm ppm to 0.5 atm %.

Of all the solar cell samples manufactured in Example 13, the one having almost the same density of nitrogen atoms in the zinc oxide layer as that of the sample of Example 15 was compared with the sample of Example 15. As a result, the efficiency of photoelectric conversion and the rate of degradation of the solar cell sample manufactured in Example 15 were 1.04 and 0.95, respectively, when the efficiency of photoelectric conversion and the rate of degradation of the solar cell sample manufactured in Example 13 were defined as 1.

EXAMPLE 16

A solar cell sample having the structure shown in FIG. 3 was manufactured following the same procedures as in Example 12 except for the method of forming a zinc oxide layer. Note that the zinc oxide layers 303 and 308 were formed following the same method as in Example 14.

In the a-Si:H solar cell sample manufactured in Example 16, the density of nitrogen atoms in each of the two zinc oxide layers was continuously changed from 500 atm. ppm to 1.5 atm %.

Another a-Si:H solar cell sample was manufactured following the same procedures as in Example 16 as a comparative example with respect to the solar cell sample of Example 16, except that the zinc oxide layers 303 and 308 containing nitrogen atoms were not formed.

The characteristics of these solar cell samples were measured following the same procedures as in Example 9. As a result, the solar cell sample of Example 16 had an efficiency of photoelectric conversion 1.19 times and a rate of degradation 0.81 times those of the solar cell sample of the Comparative Example.

EXAMPLE 17

A zinc oxide layer containing carbon and nitrogen atoms was formed following the same procedures as in each of the above examples. The zinc oxide layer containing both the carbon and nitrogen atoms was better than one not containing them.

As has been described above, in a solar cell having a structure in which a semiconductor layer is sandwiched between first and second electrodes, a zinc oxide layer containing carbon atoms, nitrogen atoms, or carbon and nitrogen atoms is formed between the semiconductor layer and at least one of the first and second electrodes, thereby obtaining the following effects.

When a solar cell is arranged such that a semiconductor layer is formed on a conductive substrate through a zinc oxide layer, the adhesion strengths between the zinc oxide layer and the conductive substrate and between the zinc oxide layer and the semiconductor layer are increased. Slight peeling which may occur due to temperature shocks and vibrations in formation of the semiconductor layer and the subsequent steps can be prevented. As a result, a solar cell having greatly improved efficiency of photoelectric conversion can be obtained.

In addition, there is also provided a solar cell having greatly improved efficiency of photoelectric conversion without increasing the series resistance since the resistivity of the zinc oxide layer can be reduced.

In addition, even in a solar cell having a semiconductor layer formed on a transparent conductive layer formed on a transparent insulating substrate, the adhesion strength between the transparent conductive layer and the semiconductor layer is increased, thereby providing a solar cell which has greatly improved efficiency of photoelectric conversion and is capable of preventing slight peeling which may occur between the transparent conductive layer and the semiconductor layer during the manufacture.

There is also provided a solar cell whose reliability can be greatly improved by effectively preventing slight peeling which may occur between the conductive substrate and the transparent conductive layer and the transparent conductive layer and the semiconductor layer in actual application under various climatic and installation conditions.

The invention may be embodied in other specific forms without departing from the spirit and essential characteristics thereof. The present examples are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of fabricating a solar cell comprising the steps of:

forming on a conductive substrate a zinc oxide layer containing carbon atoms or nitrogen atoms by a reactive sputtering method using metallic zinc as a target and using a mixture of oxygen gas and carbon dioxide gas or a mixture of oxygen gas and nitrogen gas or a nitrogen oxide gas as a sputtering gas mixture, wherein said substrate is heated within a range of room temperature to 500° C.; and forming a non-single crystalline semiconductor layer on said zinc oxide layer.

2. The method according to claim 1, wherein the mixing ratio of said sputtering gas mixture is changed.

3. A method of manufacturing a solar cell comprising the steps of:

forming on a conductive substrate a zinc oxide layer having carbon atoms or nitrogen atoms by sputtering a target of zinc oxide powder containing carbon atoms or nitrogen atoms, wherein said substrate is heated within a range of room temperature to 500° C.; and forming a non-single crystalline semiconductor layer on said zinc oxide layer.

4. A method of manufacturing a solar cell comprising the steps of:

forming on a conductive substrate a zinc oxide layer having carbon atoms or nitrogen atoms by sputtering metallic zinc target having carbon atoms or nitrogen atoms and using oxygen as a sputtering gas, wherein said substrate is heated within a range of room temperature to 500° C.; and forming a non-single crystalline semiconductor layer on said zinc oxide.

5. A method of manufacturing a solar cell comprising the steps of:

forming on a conductive substrate a zinc oxide layer having carbon atoms or nitrogen atoms by vaporizing metallic zinc in an oxygen atmosphere while supplying carbon atoms or nitrogen atoms, wherein said substrate is heated within a range of room temperature to 500° C.; and forming a non-single crystalline semiconductor layer on said zinc oxide layer.

6. A method of manufacturing a solar cell comprising the steps of:

forming on a conductive substrate a zinc oxide layer having carbon atoms or nitrogen atoms by ion plating of metallic zinc in an atmosphere comprising a mixture of oxygen and nitrogen gas or a nitrogen oxide gas, wherein said substrate is heated within a range of room temperature to 500° C.; and forming a non-single crystalline semiconductor layer on said zinc oxide layer.

7. The method according to claim 6, wherein the mixing ratio of said atmosphere gases is changed.

8. A method of fabricating a solar cell comprising the steps of:

forming on a conductive substrate a zinc oxide layer containing carbon atoms and nitrogen atoms by a reactive sputtering method using metallic zinc as a target and using a mixture of oxygen gas, carbon dioxide gas and nitrogen gas, or a nitrogen oxide gas as a sputtering gas, wherein said substrate is heated within a range of room temperature to 500° C.; and forming a non-single crystalline semiconductor layer on said zinc oxide layer.

9. The method according to claim 8, wherein the mixing ratio of said sputtering gas is changed.

10. A method of manufacturing a solar cell comprising the steps of:

forming on a conductive substrate a zinc oxide layer having carbon atoms and nitrogen atoms by sputtering a target of zinc oxide powder containing carbon atoms and nitrogen atoms, wherein said substrate is heated within a range of room temperature to 500° C.; and forming a non-single crystalline semiconductor layer on said zinc oxide layer.

11. A method of manufacturing a solar cell comprising the steps of:

forming on a conductive substrate a zinc oxide layer having carbon atoms and nitrogen atoms by sputtering metallic zinc target having carbon atoms and nitrogen atoms and using oxygen as a sputtering gas, wherein said substrate is heated within a range of room temperature to 500° C.; and forming a non-single crystalline semiconductor layer on said zinc oxide layer.

12. A method of manufacturing a solar cell comprising the steps of:

forming on a conductive substrate a zinc oxide layer having carbon atoms and nitrogen atoms by vaporizing metallic zinc in an oxygen atmosphere while supplying carbon and nitrogen atoms, wherein said substrate is heated within a range of room temperature to 500° C.; and forming a non-single crystalline semiconductor layer on said zinc oxide layer.

13. A method of manufacturing a solar cell comprising the steps of:

forming on a conductive substrate a zinc oxide layer having carbon atoms and nitrogen atoms by ion plating of metallic zinc in a gas atmosphere comprising a mixture of oxygen gas and nitrogen gas or a nitrogen oxide gas, wherein said substrate is heated within a range of room temperature to 500° C.; and forming a non-single crystalline semiconductor layer on said zinc oxide layer.

14. The method according to claim 13, wherein the mixing ratio of said gas atmosphere is changed.

15. A method of fabricating a solar cell comprising the steps of:

forming a zinc oxide layer containing carbon atoms or nitrogen atoms on a conductive substrate heated within the range of room temperature to 500° C., by ion plating of metallic zinc containing carbon atoms or nitrogen atoms in an atmosphere of an oxide gas; and forming a non-single crystalline semiconductor layer on said zinc oxide layer.

16. A method of fabricating a solar cell comprising the steps of:

forming a zinc oxide layer containing carbon atoms or nitrogen atoms on a conductive substrate heated within the range of room temperature to 500° C., by ion plating of metallic zinc containing carbon atoms or nitrogen atoms in an atmosphere of an oxide gas and a gas containing carbon; and forming a non-single crystalline semiconductor layer on said zinc oxide layer.

17. A method of fabricating a solar cell comprising the steps of:

forming a zinc oxide layer containing carbon atoms and nitrogen atoms on a conductive substrate heated within the range of room temperature to 500° C., by ion plating of metallic zinc containing carbon atoms and nitrogen atoms in an atmosphere of an oxide gas; and forming a non-single crystalline semiconductor layer on said zinc oxide layer.

18. A method of fabricating a solar cell comprising the steps of:

forming a zinc oxide layer containing carbon atoms and nitrogen atoms on a conductive substrate heated within the range of room temperature to 500° C., by ion plating of metallic zinc containing carbon atoms and nitrogen atoms in an atmosphere of an oxide gas and a gas containing carbon; and forming a non-single crystalline semiconductor layer on said zinc oxide layer.

19. A method of fabricating a solar cell comprising the steps of:

forming on a substrate a zinc oxide layer containing carbon atoms or nitrogen atoms by a reactive sputtering method using metallic zinc as a target and using a mixture of oxygen gas and carbon dioxide gas or a mixture of oxygen gas and nitrogen gas or a nitrogen oxide gas as a sputtering gas mixture, wherein said substrate is heated within a range of room temperature to 500° C.; and forming a non-single crystalline semiconductor layer on said zinc oxide layer.

20. The method according to claim 19, wherein the mixing ratio of said sputtering gas mixture is changed.

21. A method of manufacturing a solar cell comprising the steps of:

forming on a substrate a zinc oxide layer having carbon atoms or nitrogen atoms by sputtering a target of zinc oxide powder containing carbon atoms or nitrogen atoms, wherein said substrate is heated within a range of room temperature to 500° C.; and forming a non-single crystalline semiconductor layer on said zinc oxide layer.

22. A method of manufacturing a solar cell comprising the steps of:

forming on a substrate a zinc oxide layer having carbon atoms or nitrogen atoms by sputtering a metallic zinc target having carbon atoms or nitrogen atoms and using oxygen as a sputtering gas, wherein said substrate is heated within a range of room temperature to 500° C.; and forming a non-single crystalline semiconductor layer on said zinc oxide layer.

23. A method of manufacturing a solar cell comprising the steps of:

forming on a substrate a zinc oxide layer having carbon atoms or nitrogen atoms by vaporizing metallic zinc in an oxygen atmosphere while supplying carbon atoms or nitrogen atoms, wherein said substrate is heated within a range of room temperature to 500° C.; and forming a non-single crystalline semiconductor layer on said zinc oxide layer.

24. A method of manufacturing a solar cell comprising the steps of:

forming on a substrate a zinc oxide layer having carbon atoms or nitrogen atoms by ion plating of metallic zinc in an atmosphere comprising a mixture of oxygen and nitrogen gas or a nitrogen oxide gas, wherein said substrate is heated within a range of room temperature to 500° C.; and forming a non-single crystalline semiconductor layer on said zinc oxide layer.

25. The method according to claim 24, wherein the mixing ratio of said atmosphere gases is changed.

26. A method of fabricating a solar cell comprising the steps of:

forming on a substrate a zinc oxide layer containing carbon atoms and nitrogen atoms by a reactive sputtering method using metallic zinc as a target and using a mixture of oxygen gas, carbon dioxide gas and nitrogen gas, or a nitrogen oxide gas as a sputtering gas, wherein said substrate is heated within a range of room temperature to 500° C.; and forming a non-single crystalline semiconductor layer on said zinc oxide layer.

27. The method according to claim 26, wherein the mixing ratio of said sputtering gas is changed.

28. A method of manufacturing a solar cell comprising the steps of:

forming on a substrate a zinc oxide layer having carbon atoms and nitrogen atoms by sputtering a target of zinc oxide powder containing carbon atoms and nitrogen atoms, wherein said substrate is heated within a range of room temperature to 500° C.; and forming a non-single crystalline semiconductor layer on said zinc oxide layer.

29. A method of manufacturing a solar cell comprising the steps forming on a substrate a zinc oxide layer having carbon atoms and nitrogen atoms by sputtering a metallic zinc target having carbon atoms and nitrogen atoms and using oxygen as a sputtering gas, wherein said substrate is heated within a range of room temperature to 500° C.; and forming a non-single crystalline semiconductor layer on said zinc oxide layer.

30. A method of manufacturing a solar cell comprising the steps of:

forming on a substrate a zinc oxide layer having carbon atoms and nitrogen atoms by vaporizing metallic zinc in an oxygen atmosphere while supplying carbon and nitrogen atoms, wherein said substrate is heated within a range of room temperature to 500° C.; and forming a non-single crystalline semiconductor layer on said zinc oxide layer.

31. A method of manufacturing a solar cell comprising the steps of:

forming on a substrate a zinc oxide layer having carbon atoms and nitrogen atoms by ion plating of metallic zinc in a gas atmosphere comprising a mixture of oxygen gas and nitrogen gas or a nitrogen oxide gas, wherein said substrate is heated within a range of room temperature to 500° C.; and forming a non-single crystalline semiconductor layer on said zinc oxide layer.

32. The method according to claim 31, wherein the mixing ratio of said gas atmosphere is changed.

33. A method of fabricating a solar cell comprising the steps of:
- forming a zinc oxide layer containing carbon atoms or nitrogen atoms on a substrate heated within the range of room temperature to 500° C., by ion plating of metallic zinc containing carbon atoms or nitrogen atoms in an atmosphere of an oxide gas; and
- forming a non-single crystalline semiconductor layer on said zinc oxide layer.

34. A method of fabricating a solar cell comprising the steps of:
- forming a zinc oxide layer containing carbon atoms or nitrogen atoms on a substrate heated within the range of room temperature to 500° C., by ion plating of metallic zinc containing carbon atoms or nitrogen atoms in an atmosphere of an oxide gas and a gas containing carbon; and
- forming a non-single crystalline semiconductor layer on said zinc oxide layer.

35. A method of fabricating a solar cell comprising the steps of:
- forming a zinc oxide layer containing carbon atoms and nitrogen atoms on a substrate heated within the range of room temperature to 500° C., by ion plating of metallic zinc containing carbon atoms and nitrogen atoms in an atmosphere of an oxide gas; and
- forming a non-single crystalline semiconductor layer on said zinc oxide layer.

36. A method of fabricating a solar cell comprising the steps of:
- forming a zinc oxide layer containing carbon atoms and nitrogen atoms on a substrate heated within the range of room temperature to 500° C., by ion plating of metallic zinc containing carbon atoms and nitrogen atoms in an atmosphere of an oxide gas and a gas containing carbon; and
- forming a non-single crystalline semiconductor layer on said zinc oxide layer.

* * * * *

UNITED STATES PATENT AND TRADEMARK OFFICE
CERTIFICATE OF CORRECTION

PATENT NO. : 5,420,043

DATED : May 30, 1995

INVENTOR(S) : MITSUYUKI NIWA

Page 1 of 2

It is certified that error appears in the above-identified patent and that said Letters Patent is hereby corrected as shown below:

ON TITLE PAGE

In [56] References Cited, under OTHER PUBLICATIONS:
Under "Nineteenth IEEE", "Tadnem" should read --Tandem-- and under "Solar Energy Materials", ""Tin-and" should read --"Tin- and--.

COLUMN 8

Line 25, "first second" should read --second--.

COLUMN 9

Line 11, "form" should read --from--.

COLUMN 14

Line 6, "sources" should read --source--.

COLUMN 15

Line 47, "3 mw/cm$^3$" should read --3 mW/cm$^3$--.

COLUMN 16

Line 34, "at" should read --to--.

COLUMN 18

Line 68, "semiconductor layer" should read --semiconductor layer 205--.

UNITED STATES PATENT AND TRADEMARK OFFICE
CERTIFICATE OF CORRECTION

PATENT NO. : 5,420,043
DATED : May 30, 1995
INVENTOR(S) : MITSUYUKI NIWA

It is certified that error appears in the above-identified patent and that said Letters Patent is hereby corrected as shown below:

COLUMN 23

Line 18, "semiconductor layer" should read --semiconductor layer 205--.

COLUMN 26

Line 17, "formed. The" should read --formed. ¶ The--.

COLUMN 29

Line 35, "metallic" should read --a metallic--.
    Line 40, "oxide." should read --oxide layer.--.

Signed and Sealed this

Twenty-sixth Day of September, 1995

Attest:

BRUCE LEHMAN

*Attesting Officer*    *Commissioner of Patents and Trademarks*